(12) United States Patent
Shim et al.

(10) Patent No.: US 10,340,315 B2
(45) Date of Patent: Jul. 2, 2019

(54) ORGANIC LIGHT EMITTING DISPLAY WITH COLOR FILTER LAYERS

(71) Applicant: SAMSUNG DISPLAY CO., LTD., Yongin-si, Gyeonggi-do (KR)

(72) Inventors: Ji-hye Shim, Hwaseong-si (KR); Namsu Kang, Seoul (KR); Yeon-woo Lee, Chungcheongbuk-do (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/342,147

(22) Filed: Nov. 3, 2016

(65) Prior Publication Data

US 2017/0345875 A1 Nov. 30, 2017

(30) Foreign Application Priority Data

May 25, 2016 (KR) .................. 10-2016-0064231

(51) Int. Cl.
*H01L 51/00* (2006.01)
*H01L 51/50* (2006.01)
*H01L 51/52* (2006.01)
*H01L 27/32* (2006.01)

(52) U.S. Cl.
CPC ........ *H01L 27/322* (2013.01); *H01L 27/3209* (2013.01); *H01L 27/3246* (2013.01); *H01L 51/0032* (2013.01); *H01L 51/5056* (2013.01); *H01L 51/5072* (2013.01); *H01L 51/5088* (2013.01); *H01L 51/5237* (2013.01); *H01L 51/5284* (2013.01); *H01L 27/3213* (2013.01)

(58) Field of Classification Search
CPC .......................................... H01J 1/62
USPC ................. 257/89, 59, 72; 303/503
See application file for complete search history.

(56) References Cited

U.S. PATENT DOCUMENTS

| 6,867,549 B2 | 3/2005 | Cok et al. | |
|---|---|---|---|
| 2007/0228938 A1* | 10/2007 | Hatwar | H01L 27/3213 313/504 |
| 2011/0073885 A1* | 3/2011 | Kim | H01L 27/3211 257/89 |
| 2011/0095276 A1* | 4/2011 | Imai | H01L 27/322 257/40 |

(Continued)

FOREIGN PATENT DOCUMENTS

| EP | 1339112 A2 | 8/2003 |
|---|---|---|
| KR | 10-0478759 B1 | 3/2005 |

(Continued)

*Primary Examiner* — Sheng-Bai Zhu
(74) *Attorney, Agent, or Firm* — Lee & Morse, P.C.

(57) ABSTRACT

A display device includes first to fourth electrodes spaced from each other on a base surface and a fifth electrode spaced from the first to fourth electrodes. A first light emitter is between the first to fourth electrodes and the fifth electrode and overlaps the first to fourth electrodes. A second light emitter is between the fourth and fifth electrodes and overlaps at least one of the first or second electrodes. A third light emitter is between the first to fourth electrodes and the fifth electrode and overlaps at least one of the third or fourth electrodes. A charge generating is layer between the first and second light emitters and between the first and third light emitters. Color filters transmit light from the light emitters in different wavelength ranges.

19 Claims, 25 Drawing Sheets

(56) References Cited

U.S. PATENT DOCUMENTS

| | | | |
|---|---|---|---|
| 2012/0097933 A1* | 4/2012 | Ando | H01L 27/3218 257/40 |
| 2012/0242218 A1* | 9/2012 | Yoshinaga | H01L 27/3213 313/504 |
| 2014/0183471 A1 | 7/2014 | Heo | |
| 2014/0247200 A1* | 9/2014 | Jinta | H01L 25/048 345/76 |
| 2014/0319470 A1* | 10/2014 | Kim | H01L 27/322 257/40 |
| 2015/0270319 A1* | 9/2015 | Ishii | H01L 27/3246 257/40 |
| 2016/0293676 A1 | 10/2016 | Komatsu | |

FOREIGN PATENT DOCUMENTS

| | | |
|---|---|---|
| KR | 10-0823511 B1 | 4/2008 |
| KR | 10-1241131 B1 | 3/2013 |
| KR | 10-2014-0141372 A | 12/2014 |
| KR | 10-2015-0060200 A | 6/2015 |
| KR | 10-1582488 B1 | 1/2016 |
| WO | WO 2015/072143 A1 | 5/2015 |

\* cited by examiner

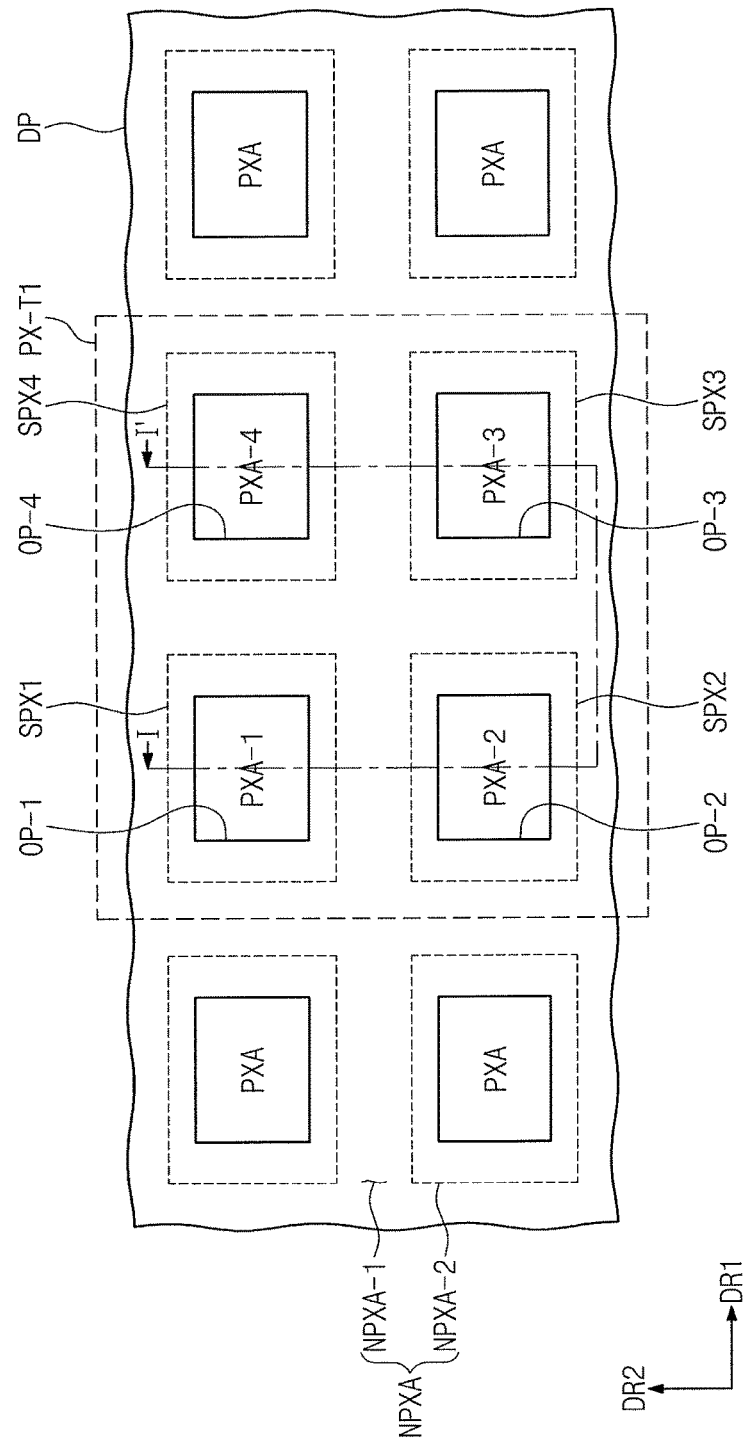

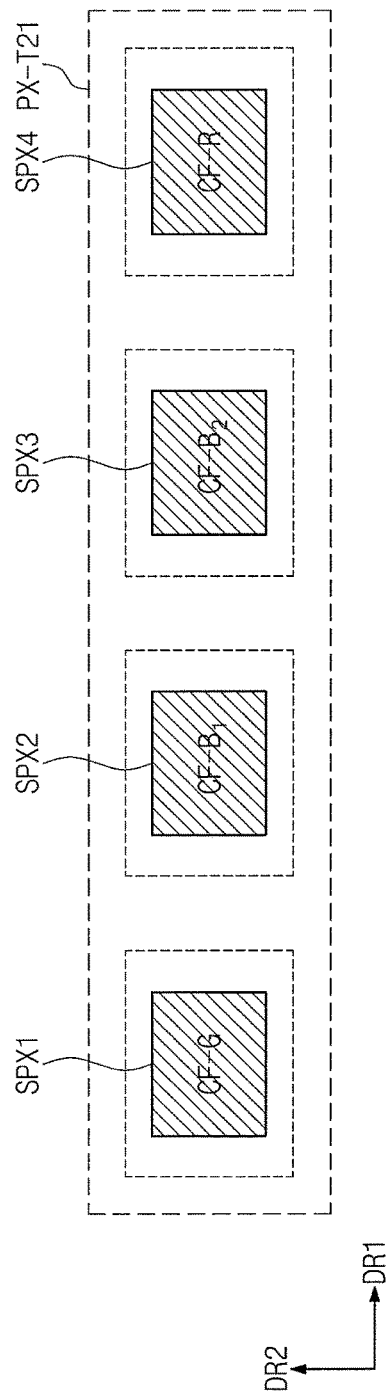
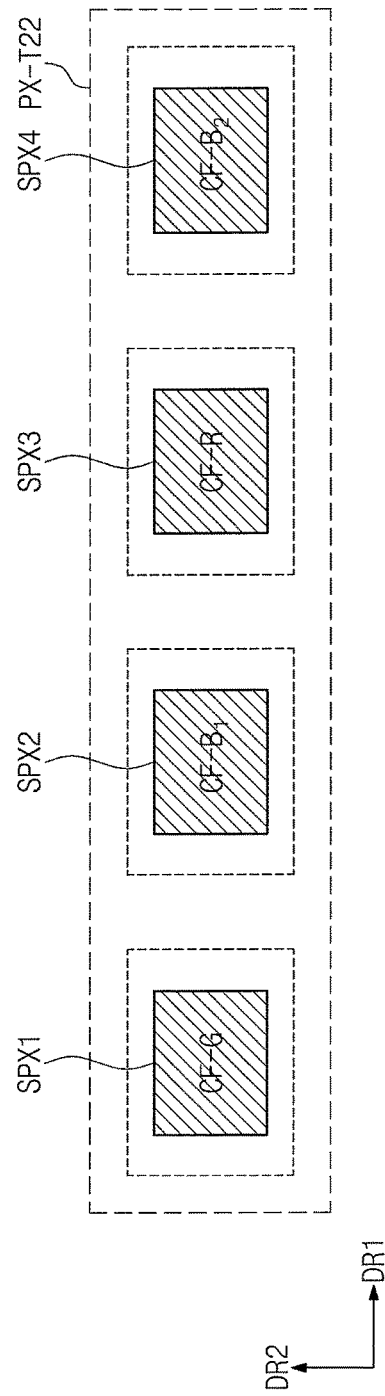

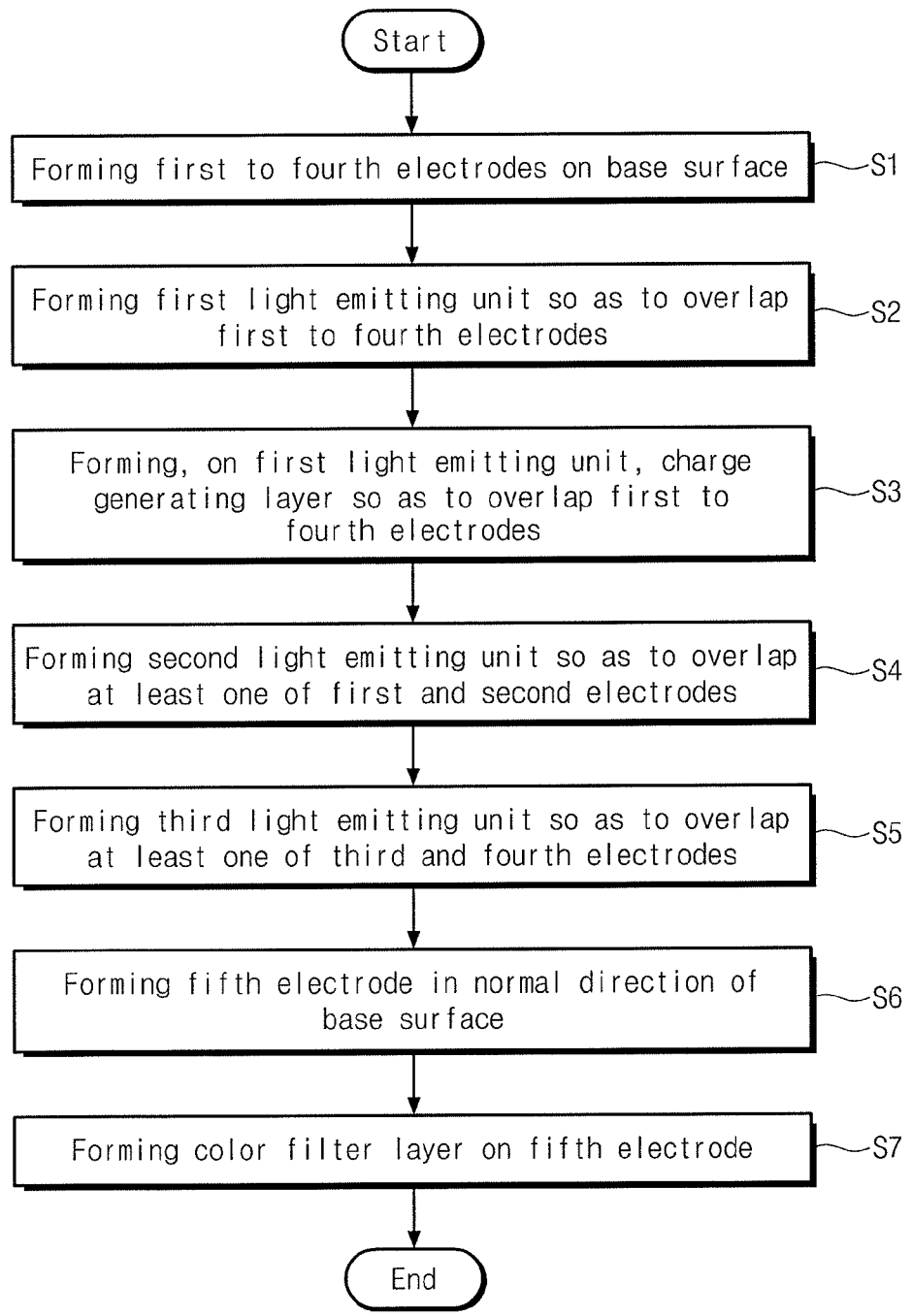

ORGANIC LIGHT EMITTING DISPLAY WITH COLOR FILTER LAYERS

CROSS-REFERENCE TO RELATED APPLICATION

Korean Patent Application No. 10-2016-0064231, filed on May 25, 2016, and entitled, "Organic Light Emitting Display," is incorporated by reference herein in its entirety.

BACKGROUND

1. Field

One or more embodiments herein relate to an organic light emitting display.

2. Description of the Related Art

An organic light emitting diode is a self-luminous device which may be used in a display device to produce wide viewing angles and excellent contrast. An organic light emitting diode includes one or more functional organic layers between an anode and cathode. The functional organic layers may include a hole injection/transport layer, a light emitting layer, and an electron injection/transport layer.

When voltages are applied to the anode and a cathode, holes injected from the anode move to a light emitting layer via a hole transport layer and electrons injected from the cathode move to a light emitting layer via an electron transport layer. The holes and electrons recombine in the light emitting layer to create excitons. Light is generated while the excitons transition from an excited state to a ground state.

An organic light emitting device may include a white organic light emitting device with a high light emitting efficiency. A white organic light emitting device may include light emitting units in a light emitting layer. The light emitting units are different from each other and are used to respectively emit red, blue, and green light.

SUMMARY

In accordance with one or more embodiments, an organic light emitting display device includes first to fourth electrodes spaced apart from each other on a base surface; a fifth electrode spaced apart from the first to fourth electrodes in a normal direction of the base surface; a first light emitter between the first to fourth electrodes and the fifth electrode and overlapping the first to fourth electrodes; a second light emitter between the fourth and fifth electrodes and overlapping at least one of the first or second electrodes; a third light emitter between the first to fourth electrodes and the fifth electrode and overlapping at least one of the third or fourth electrodes; a charge generating layer between the first and second light emitters units and between the first and third light emitters; and a color filter layer including a first color filter to transmit light from the first light emitter in a first wavelength range, a second color filter to transmit from the second light emitter in a second wavelength range, and a third color filter to transmit light from the third light emitter in a third wavelength range.

An area of the first color filter may be greater than areas of each of the second and third color filters. The first to fourth electrodes may be in a matrix on the base surface including two rows and two columns, and the first to fourth electrodes may be sequentially arranged counterclockwise from an upper left end of the matrix.

The second light emitter may overlap the first and second electrodes and the third light emitter may overlap the third and fourth electrodes. The second light emitter may be between the first light emitter and fifth electrodes and the third light emitter may be between the first light emitter and fifth electrodes.

The first color filter may include first and second partial color filters and the first and second partial color filters may correspond to each of the first and third electrodes or to each of the second and fourth electrodes. The first and second partial color filters may correspond to each of the first and third electrodes, the second color filter may correspond to the second electrode, and the third color filter may correspond to the fourth electrode.

The first color filter may correspond to each of the first and fourth electrodes or to the second and third electrodes. The first color filter may correspond to each of the second and third electrodes, the second color filter may correspond to the first electrode, and the third color filter may correspond to the fourth electrode.

The base surface may include first to fourth light emitting regions corresponding to each of the first to fourth electrodes and a non-light emitting region between the first to fourth light emitting regions, the first color filter may overlap the first and fourth light emitting regions and portions of the non-light emitting region between the first and fourth light emitting regions or the second and third light emitting regions and portions of the non-light emitting region between the second and third light emitting regions.

The second light emitter may overlap the first and fourth electrodes and the third light emitter may overlap the second and third electrodes. The first to fourth electrodes may be sequentially arrayed on the base surface in one direction. The base surface may include first to fourth light emitting regions that correspond to each of the first to fourth electrodes, and a non-light emitting region between the first to fourth light emitting regions. The color filter layer may include a black matrix overlapping the non-light emitting region. The first color filter may include a first partial color filter corresponding to one of the first or second electrodes and a second partial color filter corresponding to one of the third or fourth electrodes.

The second light emitter may overlap the first and second electrodes and the third light emitter may overlaps the third and fourth electrodes. The second light emitter may overlap an electrode, which does not correspond to the first partial color filter, among the first and second electrodes, and the third light emitter may overlap an electrode, which does not correspond to the second partial color filter, among the third and fourth electrodes. The second color filter may overlap the second light emitter in the normal direction of the base surface, and the third color filter may overlap the third light emitter in the normal direction of the base surface.

The base surface may include first to fourth light emitting regions corresponding to each of the first to fourth electrodes, and a non-light emitting region between the first to fourth light emitting regions. The first color filter may overlap the second and third light emitting regions and portions of the non-light emitting region between the second and third light emitting regions.

The light in the first wavelength range may have a peak value in a range of about 400 nm to about 500 nm, light in the second wavelength range may have a peak value in a range of about 500 nm to about 600 nm, and light in the third wavelength range may have a peak value in a range of about 600 nm to about 700 nm. Each of the first to third light emitters may include a hole control layer; an electron control layer; and an organic light emitting layer between the hole control layer and the electron control layer, the organic light emitting layer to emit light in a specific wavelength range.

In accordance with one or more other embodiments, a method for manufacturing an organic light emitting display device includes forming a first to fourth electrodes spaced apart from each other on a base surface; forming a first light emitter overlapping the first to fourth electrodes on the base surface; forming a charge generating layer overlapping the first to fourth electrodes on the first light emitter; forming a second light emitter overlapping at least one of the first or second electrodes on the base surface; forming a third light emitter overlapping at least one of the third or fourth electrodes on the base surface; forming a fifth electrode overlapping the first to fourth electrodes in the normal direction of the base surface; and forming a color filter layer on the fifth electrode, the color filter layer including a first color filter to transmit light from the first light emitter in a first wavelength range, a second color filter to transmit light from the second light emitter in a second wavelength range, and a third color filter to transmit light from the third light emitter in a third wavelength range, wherein: light in the first wavelength range has a peak value in a range of about 400 nm to about 500 nm, light in the second wavelength range has a peak value in a range of about 500 nm to about 600 nm, and light in the third wavelength range has a peak value in a range of about 600 nm to about 700 nm.

BRIEF DESCRIPTION OF THE DRAWINGS

Features will become apparent to those of ordinary skill in the art by describing in detail exemplary embodiments with reference to the attached drawings in which:

FIG. 5A illustrates an embodiment of an organic light emitting display panel.

FIGS. 9A-9C illustrate disposition examples of color filters of sub pixels;

FIG. 14 illustrates an embodiment of a method for manufacturing an organic light emitting display.

DETAILED DESCRIPTION

Figure 1:
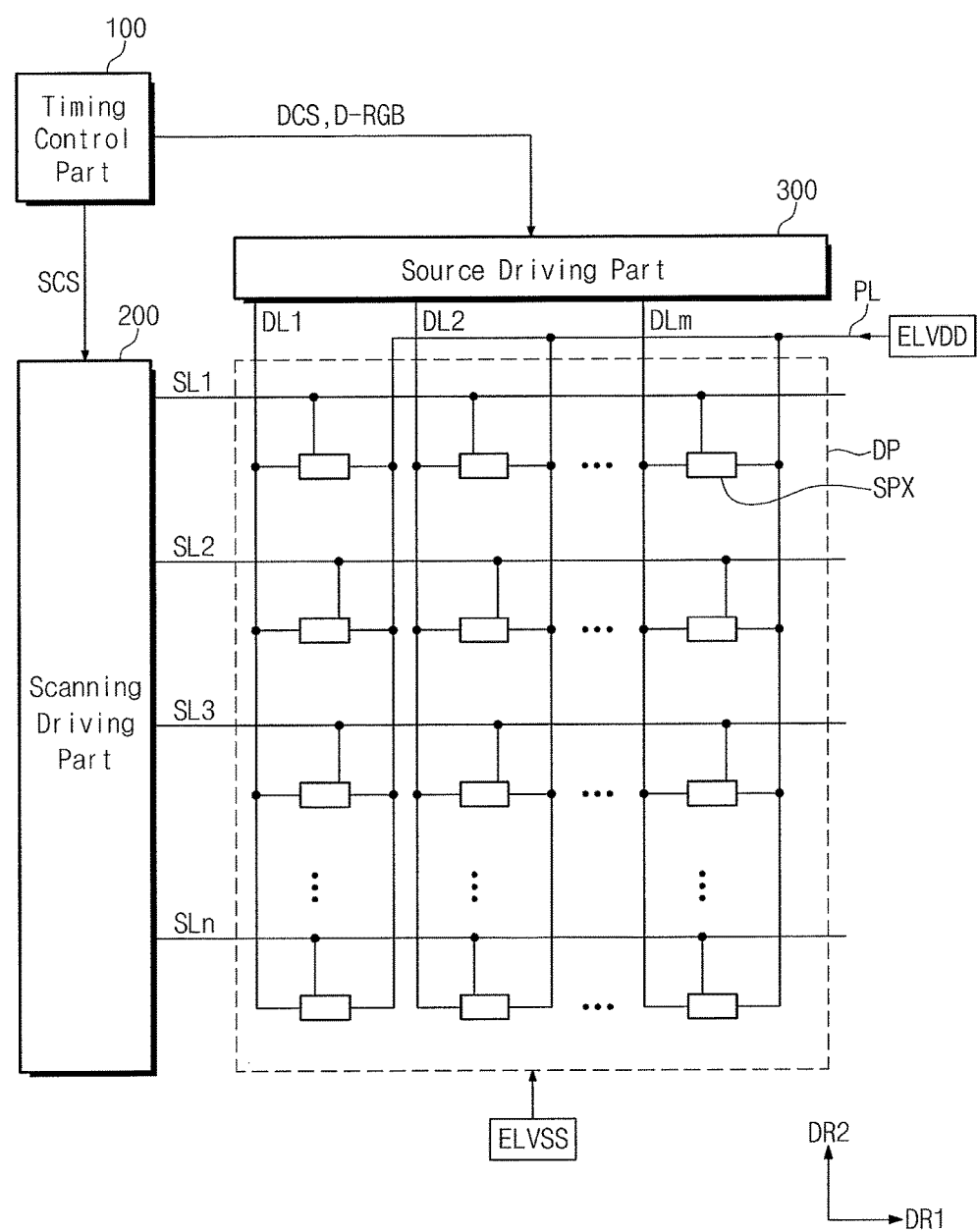
FIG. 1 illustrates an embodiment of an organic light emitting display device.

Example embodiments will now be described hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments (or portions thereof) may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 2:
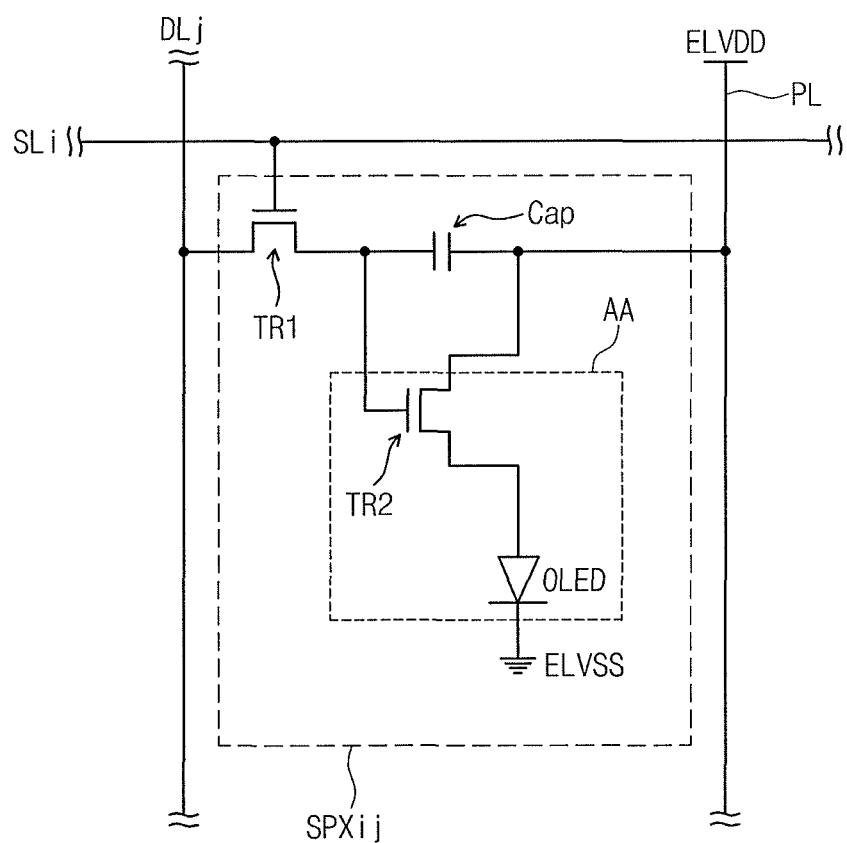
FIG. 2 illustrates an embodiment of a sub pixel.

FIG. 1 illustrates an embodiment of an organic light emitting display device, and FIG. 2 is a circuit diagram an embodiment of a sub pixel SPXij which, for example, may be included in the organic light emitting display device.

Referring to FIG. 1, the organic light emitting display device includes a timing control part 100, a scanning driving part 200, a source driving part 300, and an organic light emitting display panel DP. In one embodiment, the organic light emitting display device may further include another driving part, besides the scanning driving part 200 and the source driving part 300.

The timing control part 100 receives input image signals, converts the data format of the input image signals to meet interface specifications with the source driving part 300, and thereby generates image data D-RGB. The timing control part 100 outputs image data D-RGB and various kinds of control signals DCS and SCS.

The scanning driving part 200 receives a scanning control signal SCS from the timing control part 100. The scanning control signal SCS may include a vertical start signal for starting the operation of the scanning driving part 200, a clock signal for determining the output timings of signals, and the like. The scanning driving part 200 generates gate signals based on the scanning control signal SCS and sequentially outputs the gate signals to scan lines SL1 to SLn.

In FIG. 1, the gate signals are output from one scanning driving part 200. In another embodiment, the organic light emitting display device may include a plurality of scanning driving parts that output, for example, different gate signals.

The source driving part 300 receives a data control signal DCS and image data D-RGB from the timing control part 100. The source driving part 300 converts the image data D-RGB to data signals and outputs the data signals to source lines DL1 to DLm. The data signals may be analog voltages respectively corresponding to gray levels of the image data D-RGB.

The organic light emitting display panel DP includes the scan lines SL1 to SLn, the source lines DL1 to DLm, and sub pixels SPX. The scan lines SL1 to SLn extend in a first directional axis DR1 and are arranged in a second directional axis DR2 crossing the first directional axis DR1. The source lines DL1 to DLm cross the scan lines SL1 to SLn and are insulated from each other. In one embodiment, the organic light emitting display device DP may further include signal lines which provide the sub pixels SPX with the gate signals, the data signals, and/or other signals depending, for example, on a circuit configuration of the sub pixels SPX.

Each of the sub pixels SPX is connected to a corresponding scan line among the scan lines SL1 and SLn and to a corresponding source line among the source lines DL1 to DLm. Each of the sub pixels SPX receives a first voltage ELVDD and a second voltage ELVSS having a level lower than the first voltage ELVDD. Each of the sub pixels SPX is connected to a power line PL to which the first voltage ELVDD is applied.

FIG. 2 illustrates an equivalent circuit of an embodiment of one sub pixel SPXij connected to an ith scan line SLi and a jth source line DLj. Other sub pixels SPX in the display device of FIG. 1 may have the same equivalent circuit.

Referring to FIG. 2, a pixel driving circuit of the sub pixel SPXij may includes one or more transistors TR1 and TR2, at least one capacitor Cap, and an organic light emitting device OLED. In the present embodiment, the pixel driving circuit includes two transistors TR1 and TR2 and one capacitor Cap.

The first transistor TR1 outputs a data signal applied to the jth source line DLj based on a gate signal applied to the ith scan line SLi. The capacitor Cap stores a voltage corresponding to a data signal from the first transistor TR1. The second transistor TR2 controls driving current flowing through the organic light emitting device OLED based on the voltage stored in the capacitor Cap.

Figure 3:
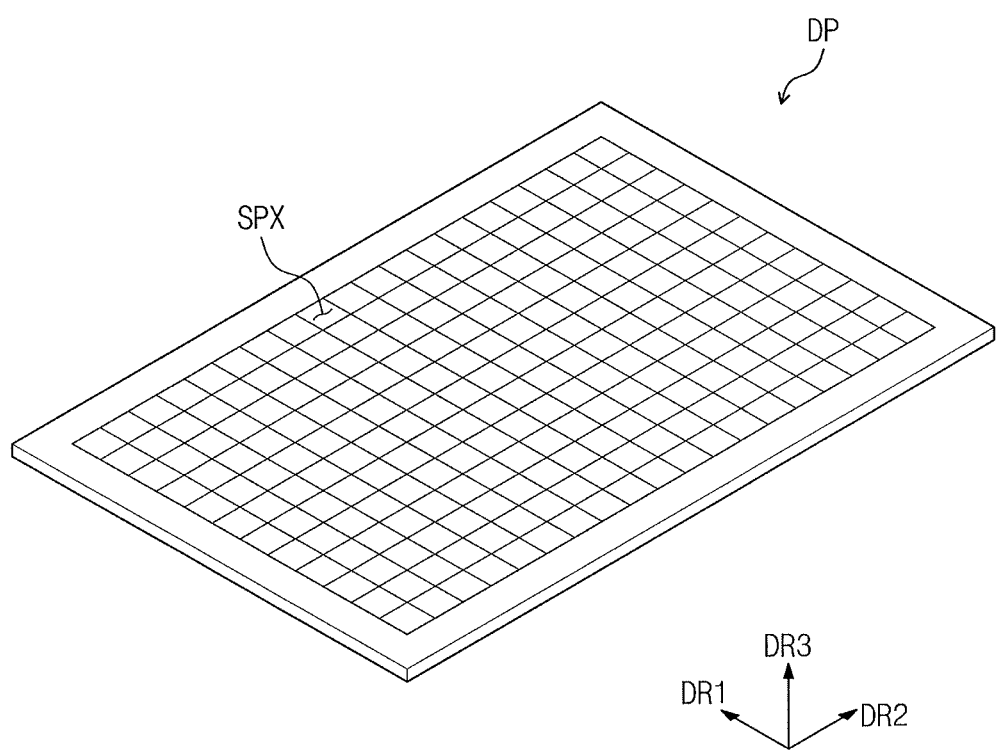
FIG. 3 illustrates an embodiment of an organic light emitting display panel.
Figure 4A:
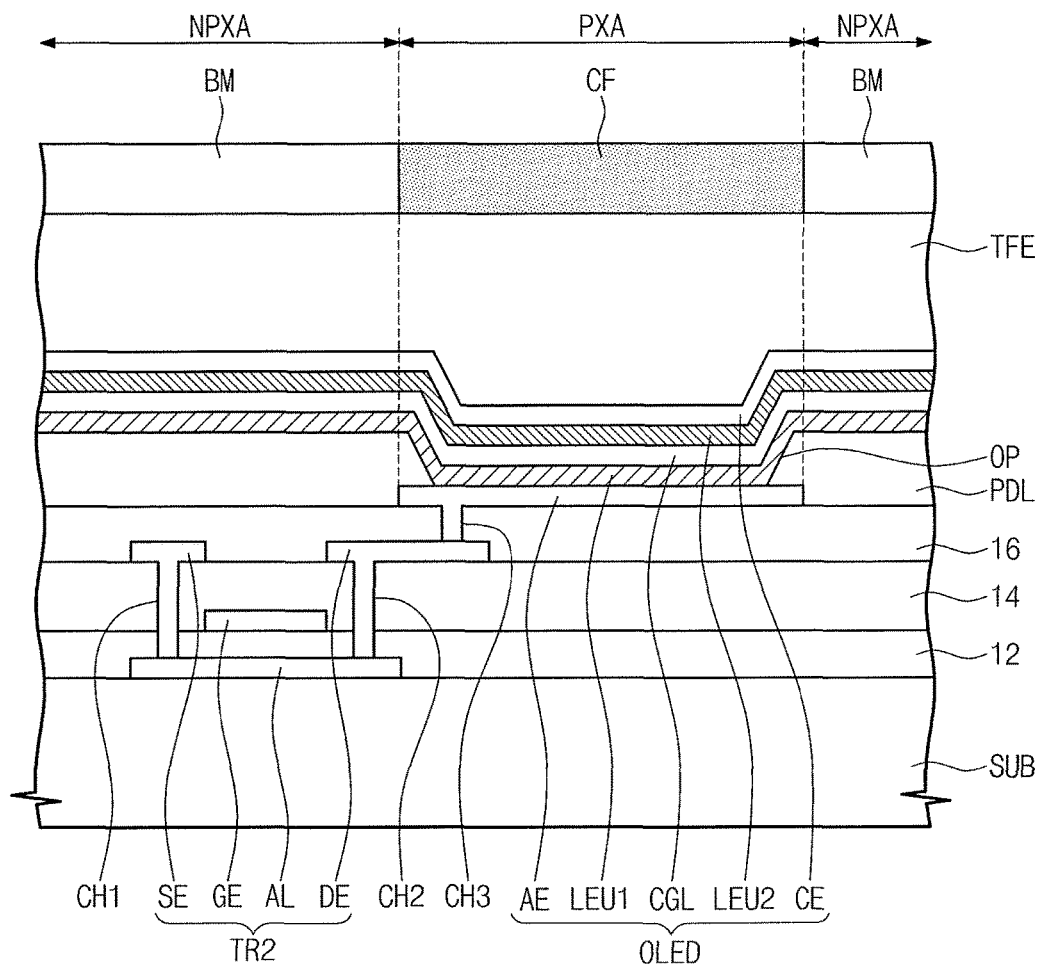
FIGS. 4A-4B illustrate examples of regions of a sub pixel.
Figure 4B:
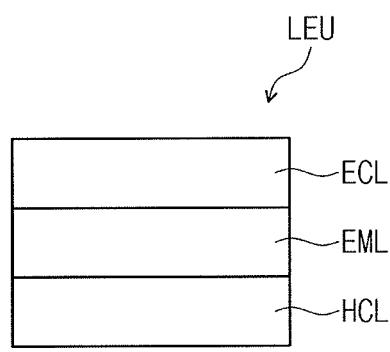

FIG. 3 illustrates an embodiment of the organic light emitting display panel DP, FIG. 4A illustrates a cross-sectional view of a region AA (see FIG. 2) of a sub pixel in an organic light emitting display panel, and FIG. 4B is a cross-sectional view of a configuration in the one region AA of a sub pixel.

Referring to FIG. 3, an organic light emitting display panel DP includes a plurality of sub pixels SPX. The sub pixels SPX may be classified into several groups according to colors of light emitted in a third directional axis DR3. For example, the sub pixels SPX may include red sub pixels, green sub pixels, and blue sub pixels.

Referring to FIG. 4A, an organic light emitting display panel DP may include a base substrate SUB, insulating layers 12, 14, and 16, transistors TR2, organic light emitting devices OLED, a color filter CF, and a black matrix BM. The display panel DP may have different or fewer features in other embodiments.

The base substrate SUB may be or include a flexible plastic substrate, e.g., a polyimide substrate, a glass substrate, a metal substrate, or the like. Semiconductor patterns AL of the transistors TR2 are on the base substrate SUB. The semiconductor patterns AL may include amorphous silicon formed, for example, at a low temperature. The semiconductor patterns AL may include metal oxide semiconductors. Functional layers may also be disposed on one surface of the base substrate SUB. The functional layers include, for example, at least one of a barrier layer or a buffer layer. The semiconductor patterns AL may be on the barrier layer or the buffer layer.

A first insulating layer 12 for covering the semiconductor patterns AL is on the base substrate SUB. The first insulating layer 12 includes an organic film and/or an inorganic film. For example, the first insulating layer 12 may include a plurality of inorganic thin films. Each of the plurality of inorganic thin films may include, for example, a silicon nitride layer and/or a silicon oxide layer.

Control electrodes GE of the transistors TR2 are on the first insulating layer 12. The control electrodes GE may be manufactured, for example, using the same photolithography process as the scan line SLi (see, e.g., FIG. 2). Thus, the control electrodes GE may include, for example, the same material as the scan line.

A second insulating layer 14 for covering the control electrodes GE is on the first insulating layer 12. The second insulating layer 14 includes an organic film and/or an inorganic film. For example, the second insulating layer 14 may include a plurality of inorganic thin films. Each of the inorganic thin films may include a silicon nitride layer and/or a silicon oxide layer.

The source line DLi (see, e.g., FIG. 2) and the power line PL (see, e.g., FIG. 2) may be on the second insulating layer 14. Input electrodes SE and output electrodes DE of the transistors TR2 are on the second insulating layer 14. The input electrodes SE are branched from the power line PL.

The input electrodes SE and the output electrodes DE are respectively connected to the semiconductor patterns AL through first through holes CH1 and second through holes CH2, which penetrate through the first insulating layer 12 and the second insulating layer 14.

A third insulating layer 16 covering the input electrodes SE and the output electrode DE is on the second insulating layer 14. The third insulating layer 16 includes an organic film and/or an inorganic film. For example, the third insulating layer 16 may include an organic material to provide a flat surface.

The transistors TR1 and capacitors Cap in FIG. 2 may be on the base substrate SUB, the first insulating layer 12, the second insulating layer 14, and the third insulating layer 16.

A pixel defining layer PDL is on the third insulating layer 16. The pixel defining layer PDL serves as another insulating layer. An opening part OP is included in the pixel defining layer PDL. The opening part OP of FIG. 4A may correspond, for example, to opening parts OP-1, OP-2, OP-3, and OP-4 of FIG. 5A.

In one embodiment, each of the organic light emitting devices OLED may include an anode AE, two light emitting units LEU1 and LEU2, a charge generation layer CGL, and a cathode CE. The anode AE is connected to the output electrodes DE through a third through hole CH3 penetrating through the third insulating layer 16. At least a portion of the anode AE may be exposed by the opening part OP of the pixel defining film PDL. The first light emitting unit LEU1 and the second light emitting unit LEU2 generate different color light. Each of the first light emitting unit LEU1 and the second light emitting unit LEU2 may have a laminated structure of the light emitting unit LEU illustrated in FIG. 4B.

Referring to FIG. 4B, the light emitting unit LEU may include a hole control layer HCL, an electron control layer ECL on the hole control layer HCL, and an organic light emitting layer EML between the hole control layer HCL and the electron control layer ECL to emit light in a predetermined wavelength range. The hole control layer HCL includes hole injection/transportation materials. The hole control layer HCL may include a plurality of functional layers, e.g., a hole injection layer, a hole transportation layer, and the like.

The functional layers may include the hole injection layer and the hole transportation layer over the hole injection layer in the third directional axis DR3. The hole injection layer may include a hole injection layer, for example, a phthlocyamine compound such as copper phthlocyamine; N,N'-diphenyl-N,N'-bis-[4-(phenyl-m-tolyl-amino)-phenyl]-biphenyl-4,4'-diamine (DNTPD), 4,4',4''-tris(3-methylphenylphenylamino) triphenylamine (m-MTDATA), 4,4'4''-Tris(N,N-diphenylamino)triphenyl amine (TDATA), 4,4',4''-tris {N,-(2-naphthyl)-N-phenylamino}-triphenylamine (2NATA), Poly(3,4-ethylenedioxythiophene)/Poly(4-styrenesulfonate) (PEDOT/PSS), Polyaniline/Dodecylbenzenesulfonic acid (PANI/DBSA), Polyaniline/Camphor sulfonicacid (PANI/CSA), and (Polyaniline)/Poly(4-styrenesulfonate) (PANI/PSS).

The hole transport region may include, for example, a hole transporting material, a carbazole-based derivative such as N-phenyl carbazole, polyvinyl carbazole, a fluorine-based derivative, or a triphenylamine-based derivative such as N,N'-bis(3-methylphenyl)-N,N'-diphenyl-[1,1-biphenyl]-4, 4'-diamine (TPD), 4,4',4''-tris(N-carbazolyl)triphenylamine (TCTA), N,N'-di(1-naphthyl)-N,N-diphenylbenzidine (NPB), 4,4'-Cyclohexylidene bis[N,N-bis(4-methylphenyl) benzenamine] (TAPC).

Organic light emitting layer EML includes an organic light emitting material, e.g., a light emitting material generating red light, green light, or blue light. Examples include a fluorescent material or a phosphorescent material. The organic light emitting layer EML may include two or more light emitting materials. For example, the organic light emitting layer EML may generate light (blue light) having a wavelength range which has the peak value in a range of about 400 nm to about 500 nm. In order to emit blue light, the organic light emitting layer EML may include, for example, fluorescent materials including any one selected from a group consisting of spiro-DPVBi, spiro-6P, distyrylbenzene (DSB), distyryl-arylene (DSA), Polyfluorene (PFO) based polymers, and poly(p-phenylene vinylene (PPV) based polymers. The organic light emitting layer EML for emitting blue light may include, for example, a metal complex such as (4,6-F2ppy)2Irpic or a dopant such as an organometallic complex.

In another example, the organic light emitting layer EML may generate light (green light) having a wavelength range which has the peak value in a range of about 500 nm to about 600 nm. The organic light emitting layer EML may include a fluorescent material including Alq3(tris(8-hydroxyquinolino)aluminum) to emit green light. The organic light emitting layer EML for emitting green light may include, for example, a metal complex such as Ir(ppy)3(fac-tris(2-phenylpyridine)iridium) or a dopant of an organometallic complex. The organic light emitting layer EML emitting green light may include a phosphorescent material including Ir(ppy)3.

In another example, the organic light emitting layer EML may generate light (red light) having a wavelength range which has the peak value in a range of about 600 nm to about 700 nm. To emit red light, the light emitting layer EML may include fluorescent material including but not limited to PBD:Eu(DBM)3(Phen)(tris(dibenzoylmethanato) phenanthoroline europium) or perylene. The light emitting layer EML for emitting red light may include a metal complex such as PIQIr(acac)(bis(1-phenylisoquinoline) acetylacetonate iridium), PQIr(acac)(bis(1-phenylquinoline) acetylacetonate iridium), PQIr(tris(1-phenylquinoline) iridium) or PtOEP(octaethylporphyrin platinum), or a dopant such as an organometallic complex. The organic light emitting layer EML for emitting red light may include a phosphorescent material such as Btp2Ir(acac).

The electron control layer ECL includes an electron transporting material. The electron transporting material may include, for example, Alq3(Tris(8-hydroxyquinolinato) aluminum), TPBi(1,3,5-Tri(1-phenyl-1H-benzo[d]imidazol-2-yl)phenyl), BCP(2,9-Dimethyl-4,7-diphenyl-1,10-phenanthroline), Bphen(4,7-Diphenyl-1,10-phenanthroline), TAZ(3-(4-Biphenylyl)-4-phenyl-5-tert-butylphenyl-1,2,4-triazole), NTAZ(4-(Naphthalen-1-yl)-3, 5-diphenyl-4H-1,2,4-triazole), tBu-PBD (2-(4-Biphenylyl)-5-(4-tert-butylphenyl)-1,3,4-oxadiazole), BAlq(Bis(2-methyl-8-quinolinolato-N1,O8)-(1,1'-Biphenyl-4-olato) aluminum), Bebq2(berylliumbis(benzoquinolin-10-olate)), ADN(9,10-di(naphthalene-2-yl)anthracene) and a mixture thereof, but the embodiment of the inventive concept is not limited thereto.

In one embodiment, the electron control layer ECL may further include a hole blocking layer in contact with the organic light emitting layer EML. The hole blocking layer may include, for example, at least one of BCP(2,9-dimethyl-4,7-diphenyl-1,10-phenanthroline) or Bphen(4,7-diphenyl-1,10-phenanthroline).

Referring again to FIG. 4A, in one embodiment, the charge generating layer CGL may be between the first light emitting unit LEU1 and the second light emitting unit LEU2. Also, the charge generating layer CGL may include an electron generating layer (e.g., an organic layer doped with an n-type dopant, where the organic layer includes an electron transporting material) including an n-type dopant, and a hole generating layer (e.g., an organic layer doped with a p-type dopant, where the organic layer includes a hole transporting material) including a p-type dopant.

FIG. 4A illustrates a structure in which the first light emitting unit LEU1 and the second light emitting unit LEU2 overlap on the third insulating layer 16. However, when only one light emitting unit is on the third insulating layer 16, the charge generating layer CGL may be on the one light emitting unit or may be omitted.

The cathode CE is spaced apart from the anode AE in the normal direction of the anode AE. The first light emitting unit LEU1, the second light emitting unit LEU2, and the charge generating layer CGL are between the anode AE and the cathode CE.

A thin film encapsulation layer TFE is on the cathode CE. The thin film encapsulation layer TFE may include a plurality of organic layers and a plurality of inorganic layers. The thin film encapsulation layer TFE may include, for example, a laminated lithium fluoride layer/aluminum oxide layer/organic monomer layer (e.g., including an acrylate-based monomer)/silicon nitride layer/organic monomer layer/silicon nitride layer. The thin film encapsulation layer TFE may protect the cathode CE from external moisture. A predetermined optical layer for improving light extracting efficiency and preventing reflection of external light may be further provided under the thin film encapsulation layer TFE.

The color filter layer is on the thin film encapsulation layer TFE. A color filter CF which transmits light having a specific wavelength range and a black matrix BM may be on the color filter layer. The color filter CF may be on a region corresponding to the anode AE on the color filter layer. The color filter CF may selectively transmit light in a specific wavelength range generated from the light emitting unit under the color filter CF. A light emitting region PXA may be formed to correspond to the anode AE, and a non-light emitting region NPXA may be formed to correspond to black matrix BM.

Figure 5B:
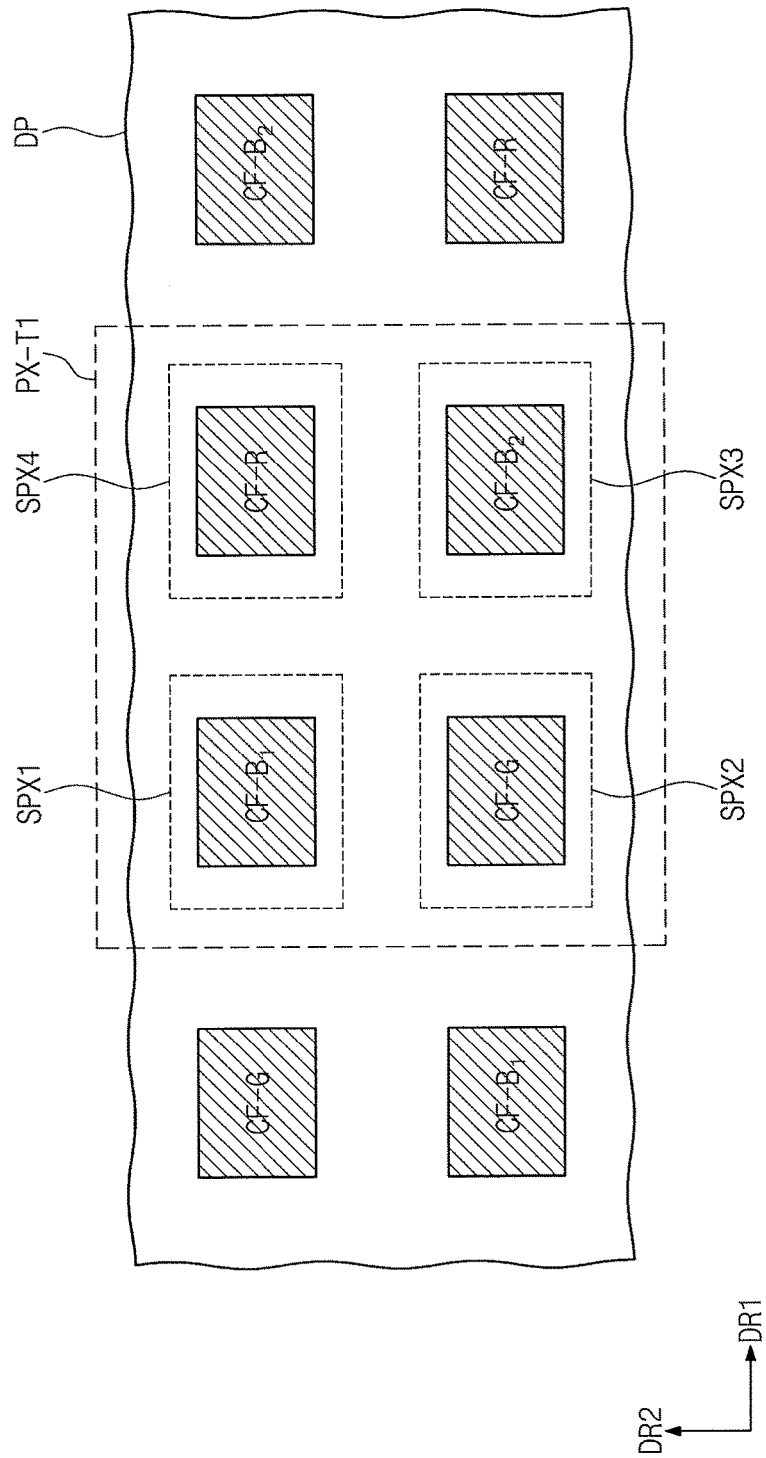
FIG. 5B illustrates an embodiment of a disposition of color filters in sub pixels.
Figure 6:
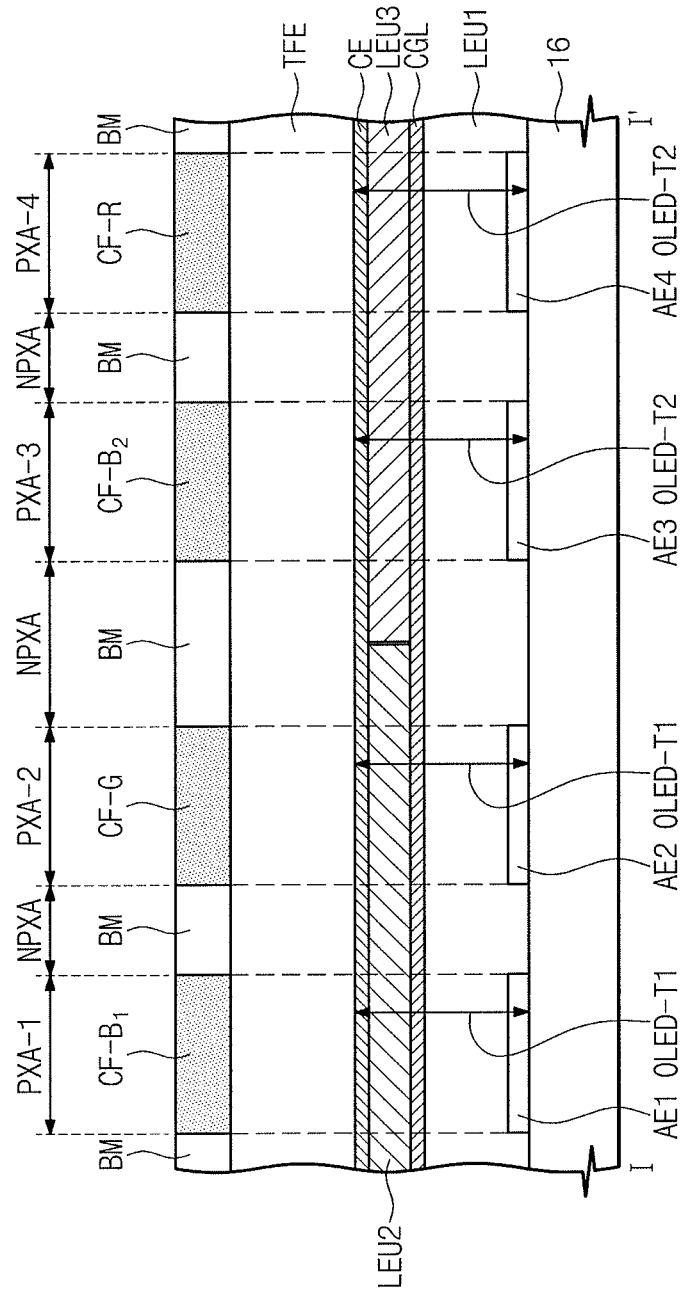
FIG. 6 illustrates an embodiment of sub pixels of one pixel.

FIG. 5A illustrates an embodiment of an organic light emitting display panel DP, and FIG. 5B illustrates an embodiment of a configuration of color filters CF-B1, CF-G, CF-B2, and CF-R of sub pixels SPX1, SPX2, SPX3, and SPX4. FIG. 6 is a cross-sectional view of sub pixels SPX1, SPX2, SPX3, and SPX4 forming one pixel in accordance with one embodiment.

Referring to FIG. 5A, an organic light emitting display panel DP is divided into a plurality of light emitting regions PXA and a non-light emitting region NPXA on a plane defined by a first directional axis DR1 and a second directional axis DR2. FIG. 5A illustrates an example of first to fourth light emitting regions PXA-1, PXA-2, PXA-3, and PXA-4 in a matrix shape. Sub pixels SPX1, SPX2, SPX3, and SPX4 may be respectively disposed on the first to fourth light emitting regions PXA-1, PXA-2, PXA-3, and PXA-4. Organic light emitting devices OLED (see, e.g., FIG. 4A) respectively included in the sub pixels SPX1, SPX2, SPX3, and SPX4 may be disposed on the first to fourth light emitting regions PXA-1, PXA-2, PXA-3, and PXA-4 of sub pixels SPX1, SPX2, SPX3, and SPX4.

The non-light emitting region NPXA may be divided into a first non-light emitting region NPXA-1 surrounding the first to fourth light emitting regions PXA-1, PXA-2, PXA-3, and PXA-4 and second non-light emitting regions NPXA-2 between the light emitting regions and the first non-light emitting region NPXA-1. Signal lines such as a scan line SLi, a source line DLi, and a power line PL (see, e.g., FIG. 2) may be disposed on the first non-light emitting regions NPXA-1. A driving circuit of a sub pixel corresponding to each of the non-light emitting regions NPXA-2 (e.g., transistors TR1 and TR2) or a capacitor Cap (see, e.g., FIG. 2) may be disposed on each of the second non-light emitting regions NPXA-2. In one embodiment, the first non-light emitting region NPXA-1 and the second non-light emitting regions NPXA-2 may not be separated from each other.

Referring to FIG. 5B, color filters CF-B1, CF-G, CF-B2, and CF-R arranged in a matrix shape may be on each of the sub pixels SPX1, SPX2, SPX3, and SPX4. The disposition of the color filters CF-B1, CF-G, CF-B2, and CF-R may be determined based on the color of light generated from the organic light emitting devices OLED in each of the sub pixels SPX1, SPX2, SPX3, and SPX4.

Referring to FIGS. 5A and 5B, the sub pixels SPX1, SPX2, SPX3, and SPX4 are arranged in a matrix shape and may define one pixel PX-T1. The one pixel PX-T1 may be a minimum unit emitting light representing one set of red, green, and blue image data.

Referring to FIG. 6, organic light emitting devices OLED-T1, OLED-T1, OLED-T2, and OLED-T2 respectively included in first to fourth sub pixels SPX1, SPX2, SPX3, and SPX4, which are in one pixel PX-T1, may be respectively disposed corresponding to first to fourth electrodes AE1, AE2, AE3, and AE4 which are spaced apart from each other. Also, in one embodiment, a fifth electrode may be spaced apart from first to fourth electrodes in the normal direction of a base surface.

A base surface according to the current embodiment may be provided by a third insulating layer 16. First to fourth electrodes AE1, AE2, AE3, and AE4 may be anode electrodes AE. A fifth electrode may be a cathode electrode CE. However, unlike FIG. 6, the first to fourth electrodes may be cathode electrodes and the fifth electrode may be an anode electrode. In this case, the voltage applied to the first to fourth electrodes may be lower than the voltage applied to the fifth electrode.

The first to fifth electrodes AE1, AE2, AE3, AE4, and CE may be transparent electrodes, semi-transparent electrodes, or opaque electrodes (or a reflective electrode) which include a conductive material. The transparent electrode or the semi-transparent electrode may include, for example, optically thin Li, Ca, LiF/Ca, LiF/Al, Al, Mg. BaF, Ba, Ag or a compound or a mixture thereof, or a transparent metal oxide (for example, indium tin oxide (ITO), indium zinc oxide (IZO), zinc oxide (ZnO), indium tin zinc oxide (ITZO), Mo, Ti, or the like, and the opaque electrode may include optically thick Ag, Mg, Al, Pt, Pd, Au, Ni, Nd, Ir, Cr, Li, Ca, LiF/Ca, LiF/Al, Mo, Ti or a compound or a mixture thereof.

Each of the first to fifth electrodes AE1, AE2, AE3, AE4, and CE may have a single layer formed of a single material, a single layer formed of a plurality of materials different from each other, or a multilayered structure having a plurality of layers formed of a plurality of materials different from each other.

The organic light emitting display device may be a bottom emission-type or a top emission-type device. For example, when the organic light emitting display device is a bottom emission-type, each of the first to fourth electrodes AE1, AE2, AE3 and AE4 may be a transparent electrode or a semitransparent electrode and the fifth electrode CE may be an opaque electrode (or a reflective electrode). When the organic light emitting display device is a top emission-type, each of the first to fourth electrodes AE1, AE2, AE3 and AE4 may be a reflective electrode and the fifth electrode CE may be a transparent electrode or a semi-transparent electrode.

The first to fourth electrodes may correspond to first to fourth anodes AE1, AE2, AE3, and AE4, and the fifth electrode may correspond to a cathode CE. In the current embodiment of FIG. 6, the first to fourth anodes AE1, AE2, AE3, and AE4 on the base surface 16 may be sequentially arrayed in a matrix shape from the upper left end in the counterclockwise direction. In one example, the first anode AE1 may be on a first row and a first column in the matrix, the second anode AE2 may be on a second row and the first column in the matrix, the third anode AE3 may be on the second row and a second column in the matrix, and the fourth anode AE4 may be on the first row and the second column in the matrix.

The organic light emitting devices OLED-T1, OLED-T1, OLED-T2, and OLED-T2 between the first to fourth anodes AE1, AE2, AE3, and AE4 and the cathode CE may respectively include two light emitting units. Each of the light emitting devices OLED-T1 and OLED-T2 may emit light generated from the two light emitting units respectively included in the light emitting devices OLED-T1 and OLED-T2 and which have peak values different from each other. According to the current embodiment, the organic light emitting device OLED-T1 may include a first light emitting unit LEU1 and a second light emitting unit LEU2, and the organic light emitting device OLED-T2 may include the first light emitting unit LEU1 and a third light emitting unit LEU3.

The first light emitting unit LEU1 is between the first to fourth anodes AE1, AE2, AE3, and AE4 and the cathode CE and overlaps the first to fourth anodes AE1, AE2, AE3, and AE4. In one embodiment, the first light emitting unit LEU1 may entirely overlap the first to fourth anodes AE1, AE2, AE3, and AE4. In the current embodiment, the first light emitting unit LEU1 may emit light (blue light) in a first wavelength range which has a peak value in a range of about 400 nm to about 500 nm.

The second light emitting unit LEU2 is between the first to fourth anodes AE1, AE2, AE3, and AE4 and the cathode CE and overlaps at least one of the first or second anodes AE1 and AE2. For example, in FIG. 6, the second light emitting unit LEU2 may be between the first light emitting unit LEU1 and cathode CE and may entirely overlaps the first and second anodes AE1 and AE2. In the current embodiment, the second light emitting unit LEU2 may emit light (green light) having a second wavelength range which has a peak value in a range of about 500 nm to about 600 nm.

The third light emitting unit LEU3 is between the first to fourth anodes AE1, AE2, AE3, and AE4 and the cathode CE to overlap at least one of the third and fourth anodes AE3 and AE4. For example, in FIG. 6, the third light emitting unit LEU3 may be between the first light emitting unit LEU1 and the cathode CE and may entirely overlap the third and fourth anodes AE3 and AE4. In the current embodiment, the third light emitting unit LEU3 may emit light (red light) having a third wavelength range which has a peak value in a range of about 600 nm to about 700 nm.

In FIG. 6, the third light emitting unit LEU3 is in contact with the second light emitting unit LEU2, but the second light emitting unit LEU2 and the third light emitting unit LEU3 may be spaced apart from each other. Also, the organic light emitting devices OLED-T1 and OLED-T2 may share a charge generating layer CGL and cathode CE formed through the same process. For example, in the embodiment of FIG. 6, the charge generating layer CGL and the cathode CE may be integrated.

In FIG. 6, a structure in which the second and third light emitting units LEU2 and LEU3 are laminated on the first light emitting unit LEU1 is illustrated. The order of laminating the first to third light emitting units LEU1, LEU2, and LEU3 may be different in another embodiment. For example, the second light emitting unit LEU2 may overlap the first and second anodes AE1 and AE2, the first light emitting unit LEU1 may be on the second light emitting unit LEU2 and overlap the first to fourth anodes AE1, AE2, AE3, and AE4. The third light emitting unit LEU3 may be on the first light emitting unit LEU1 and overlap the third and fourth anodes AE3 and AE4.

In another example, the second light emitting unit LEU2 may overlap at least one of the first or second anodes AE1 and AE2. The third light emitting unit LEU3 may overlap at least one of the third or fourth anodes AE3 and AE4. The first light emitting unit LEU1 may overlap the first to fourth anodes AE1, AE2, AE3, and AE4 on the second and third light emitting units LEU2 and LEU3. In this case, the second and third light emitting units LEU2 and LEU3 may be on the same plane.

In one embodiment, the organic light emitting devices OLED-T1 and OLED-T2 of the organic light emitting display device may respectively include the second light emitting unit LEU2 for emitting green light and the third light emitting unit LEU3 for emitting red light, together with the first light emitting unit LEU1 for emitting blue light. Accordingly, unlike a white organic light emitting display device which implements white light by mixing blue light and yellow light, the color purity with respect to each of green and red light may be improved in accordance with one or more embodiments.

Also, the organic light emitting devices OLED-T1 and OLED-T2 may correspond to the color filters, respectively. The color filters may selectively transmit peak light among peak lights emitted from two light emitting units in each of the organic light emitting devices OLED-Ti and OLED-T2.

The color filters may be classified according to the wavelength range of light selectively transmitted by each of the color filters. For example, the color filters may include a first color filter CF-B for selectively transmitting light (blue light) in a first wavelength range, a second color filter CF-G for selectively transmitting light (green light) in second wavelength range, and a third color filter CF-R for selectively transmitting light (red light) in a third wavelength range.

According to the current embodiment, the first color filter CF-B for selectively transmitting light (blue light) in the first wavelength range may include a first partial color filter CF-B1 and a second partial color filter CF-B2. Blue light emitted by the partial color filter CF-B1 and the second partial color filter CF-B2 may be the same color or different colors.

According to the embodiment in FIG. 6, the first color filter CF-B for transmitting light (blue light) in a first wavelength range may correspond to an organic light emitting device including the first light emitting unit LEU1 among the organic light emitting devices OLED-T1 and OLED-T2. The second color filter CF-G for transmitting light (green light) in a second wavelength range may correspond to an organic light emitting device including the second light emitting unit LEU2 among the organic light emitting devices OLED-T1 and OLED-T2. The third color filter CF-R for transmitting light (red light) in a third wavelength range may correspond to an organic light emitting device including the third light emitting unit LEU3 among the organic light emitting devices OLED-T1 and OLED-T2.

Accordingly, in FIG. 6, the first partial color filter CF-B1 may correspond to the first anode AE1, the second partial color filter CF-B2 may correspond to the third anode AE3, the second color filter CF-G may correspond to the second anode AE2, and the third color filter CF-R may correspond to the fourth anode AE4.

In FIG. 6, the second color filter CF-G may correspond to the second anode AE2 among the anodes AE1 and AE2 which the second light emitting unit LEU2 overlaps, but may not overlap the first anode AEL Likewise, the third color filter CF-R may correspond to the fourth anode AE4 among the anodes AE3 and AE4 which the third light emitting unit LEU3 overlaps, but may not correspond to the third anode AE3. Thus, the disposition of color filters CF-B1, CF-B2, CF-G, and CF-R may change in the laminated structure of the organic light emitting devices OLED-T1 and OLED-T2 in FIG. 6. This will be described with reference to FIGS. 7A-7C.

The first color filter CF-B is therefore on two sub pixels among the four sub pixels in one pixel. Thus, blue light may be emitted more than the red light or green light from one pixel. For example, the area of the first color filter CF-B is greater than those of the second and third color filters CF-G and CF-R. Thus, the blue organic light emitting device may not have a relatively short service life and low efficiency as is the case with other proposed arrangements. Also, white light may be implemented even with a low voltage.

Also, according to one embodiment, a specific color filter that selectively transmits light from a specific organic light emitting device of a specific wavelength range is provided at a position corresponding to the specific organic light emitting device. Thus, color purity with respect to light of the specific wavelength range may be improved.

Figure 7A:
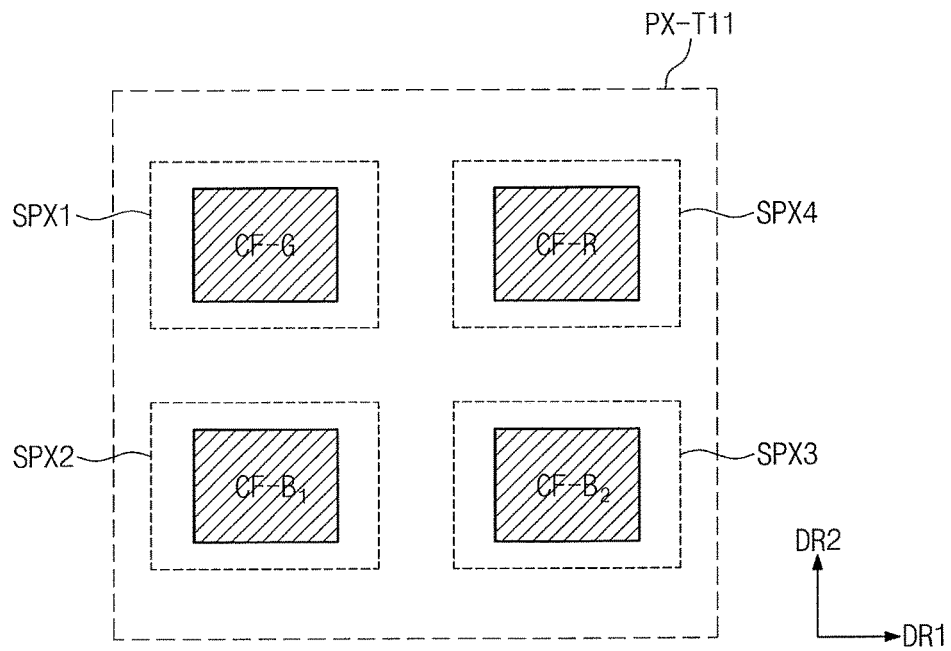
FIGS. 7A-7C illustrate disposition examples of color filters of sub pixels.
Figure 7B:
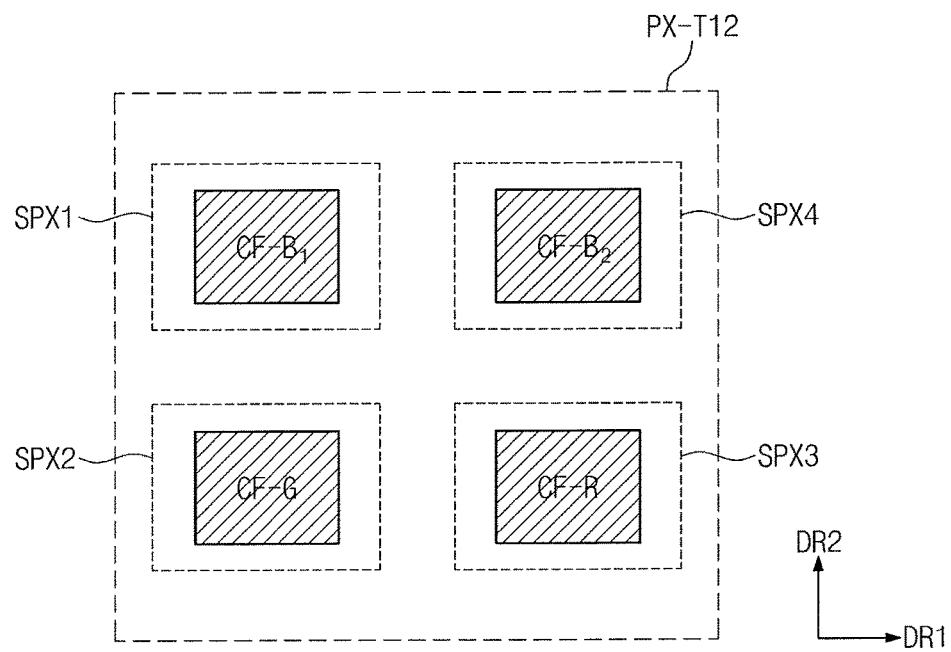
Figure 7C:
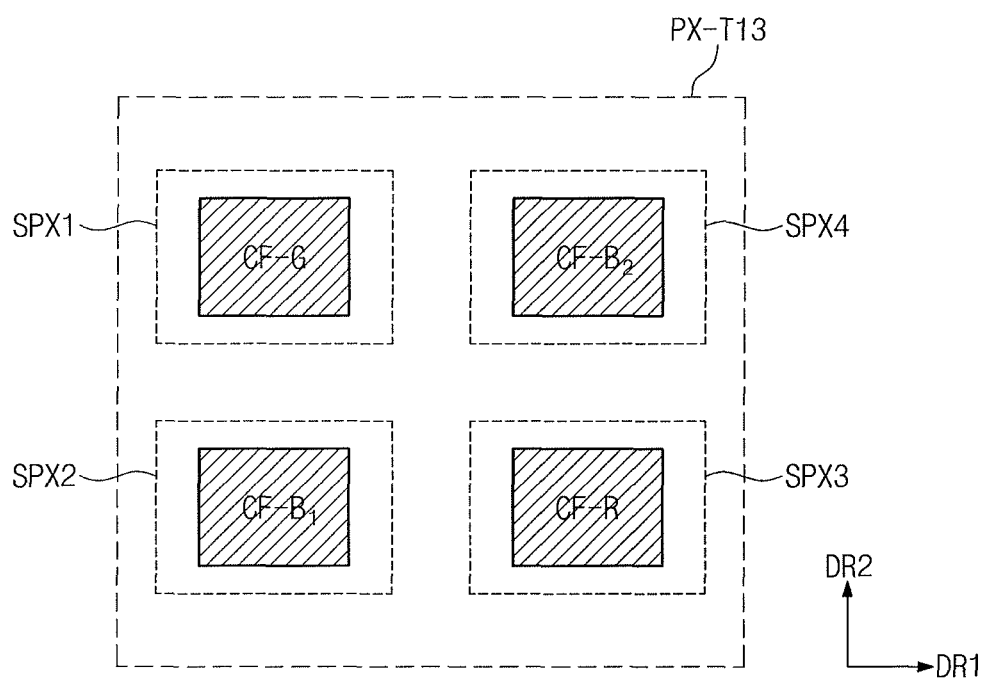

FIGS. 7A-7C are plan views illustrating the disposition of color filters CF-B1, CF-B2, CF-G, and CF-R respectively corresponding to sub pixels SPX1, SPX2, SPX3, and SPX4 arranged in a matrix shape. The color filters CF-B1, CF-B2, CF-G, and CF-R may be respectively disposed on the first to fourth sub pixels SPX1, SPX2, SPX3, and SPX4, which are arranged in a matrix shape, in a manner different from that in FIG. 5B.

Referring to FIG. 7A, the second color filter CF-G may be on the first sub pixel SPX1, the first partial color filter CF-B1 may be on the second sub pixel SPX2, the second partial color filter CF-B2 may be on the third sub pixel SPX3, and the third color filter CF-R may be on the fourth sub pixel SPX4.

Referring to FIG. 7B, the first partial color filter CF-B1 may be on the first sub pixel SPX1, the second color filter CF-G may be on the second sub pixel SPX2, the third color filter CF-R may be on the third sub pixel SPX3, and the second partial color filter CF-B2 may be on the fourth sub pixel SPX4.

Referring to FIG. 7C, the second color filter CF-G may be on the first sub pixel SPX1, the first partial color filter CF-B1 may be on the second sub pixel SPX2, the third color filter CF-R may be on the third sub pixel SPX3, and the second partial color filter CF-B2 may be on the fourth sub pixel SPX4.

According to an embodiment, the sub pixels constituting one pixel may be arranged in one direction. For example, the first to fourth sub pixels SPX1, SPX2, SPX3, and SPX4 which constitute one pixel may be sequentially arranged in one direction.

Figure 8A:
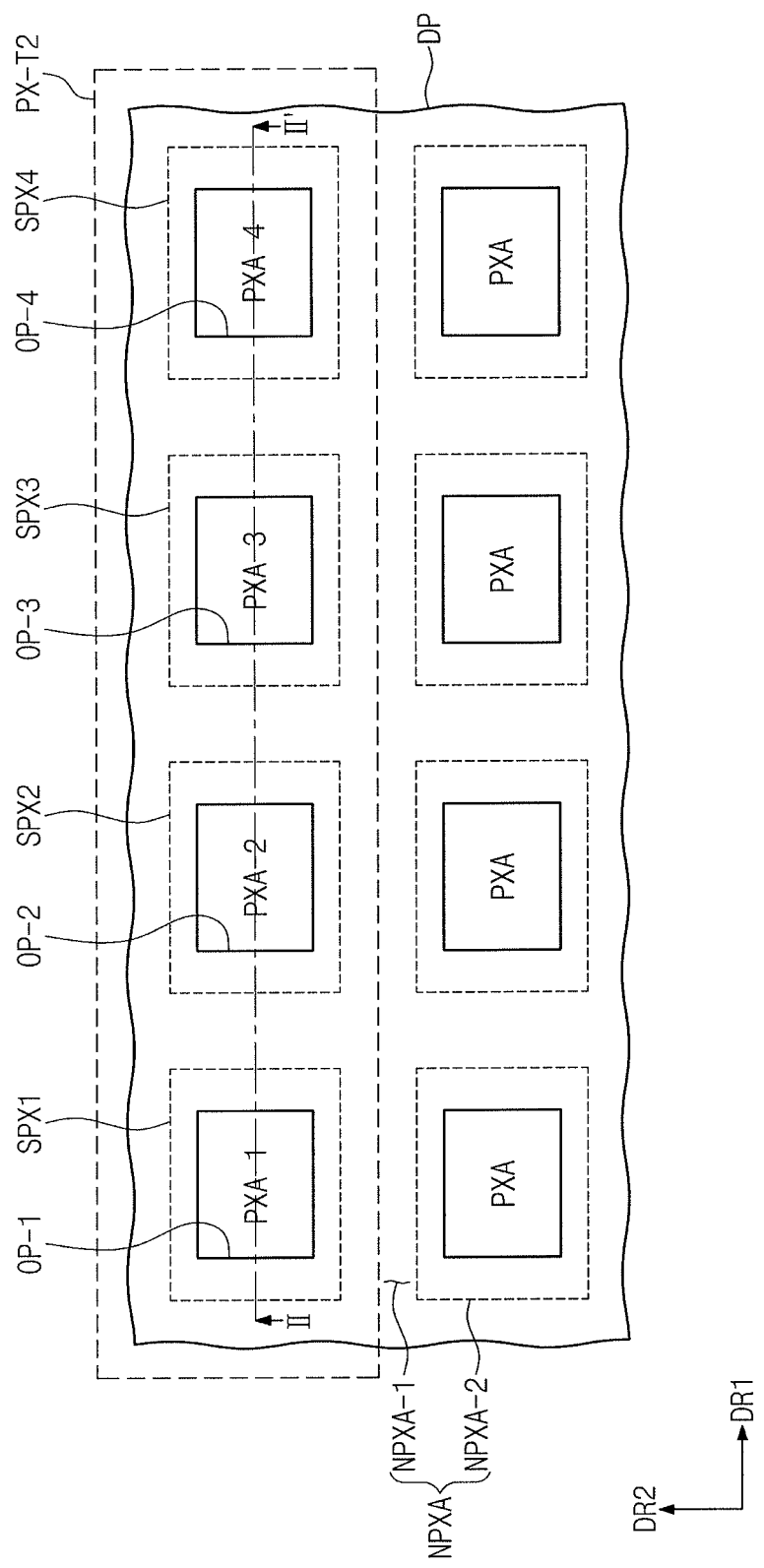
FIG. 8A illustrates an embodiment of an organic light emitting display panel including sub pixels arranged in one direction.
Figure 8B:
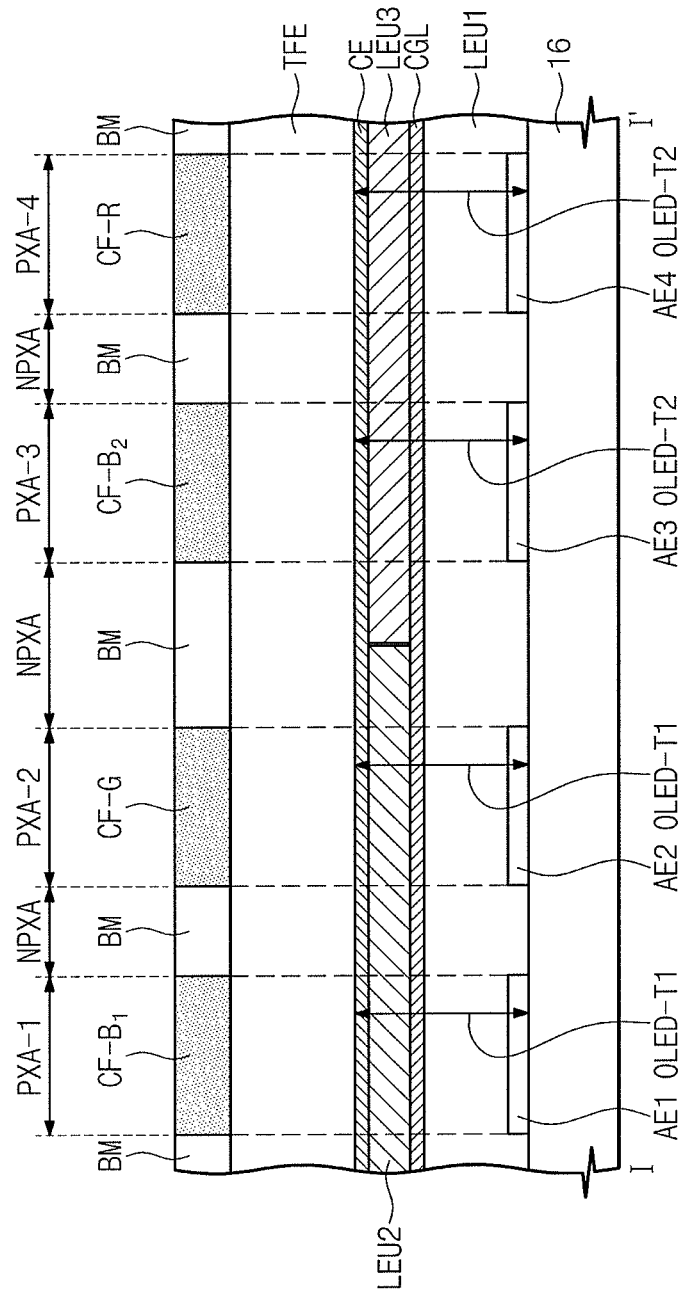
FIG. 8B illustrates a cross-sectional embodiment of sub pixels arranged in one direction.

FIG. 8A illustrates a plan view of an embodiment of an organic light emitting display panel DP including sub pixels SPX1, SPX2, SPX3, and SPX4 arranged in one direction. FIG. 8B is a cross-sectional view of the sub pixels SPX1, SPX2, SPX3, and SPX4 arranged in the one direction.

Referring to FIG. 8A, an organic light emitting display panel DP may define one pixel PX-T2 including first to fourth sub pixels SPX1, SPX2, SPX3, and SPX4 which are sequentially arranged in one direction (a first directional axis DR1).

Referring to FIG. 8B, in the one pixel PX-T2, organic light emitting devices may be respectively on the first to fourth sub pixels SPX1, SPX2, SPX3, and SPX4 such that the light respectively emitted from the first to fourth sub pixels SPX1, SPX2, SPX3, and SPX4 becomes white light.

Color filters CF-B1, CF-B2, CF-G, and CF-R respectively on the first to fourth sub pixels SPX1, SPX2, SPX3, and SPX4 may be disposed differently from that in FIG. 8B. For example, a second color filter CF-G may overlap a first anode AE1 among anodes AE1 and AE2 which a second light emitting unit LEU2 overlaps, and a third color filter CF-R may overlap a third anode AE3 among anodes AE3 and AE4 which a third light emitting unit LEU3 overlaps.

Figure 9C:
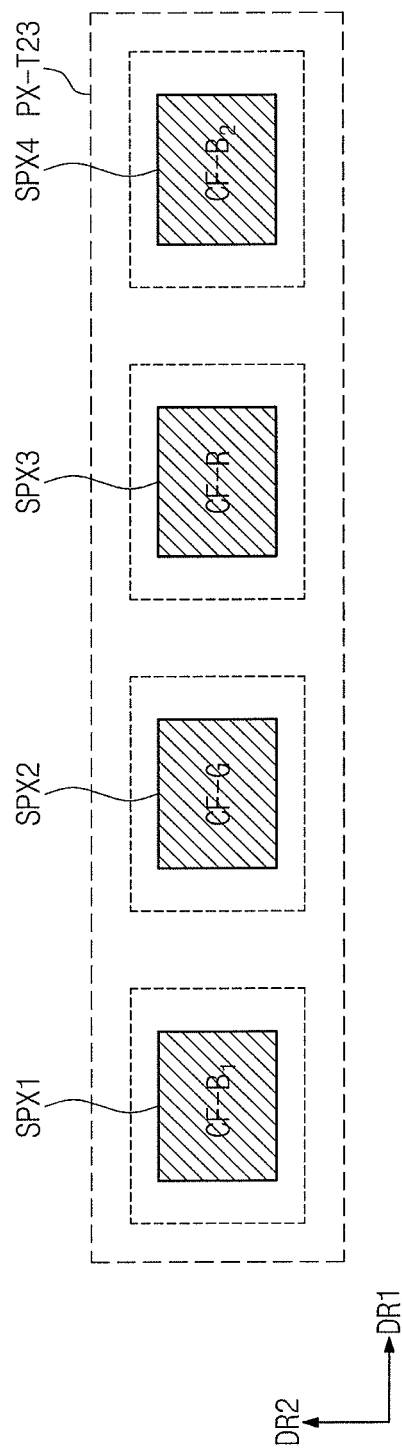

FIGS. 9A-9C illustrate plan views of an embodiment of a disposition example of color filters corresponding to first to fourth sub pixels SPX1, SPX2, SPX3, and SPX4.

Referring to FIG. 9A, a second color filter CF-G may be on the first sub pixel SPX1, a first partial color filter CF-B1 may be on the second sub pixel SPX2, a second partial color filter CF-B2 may be on the third sub pixel SPX3, and a third color filter CF-R may be on the fourth sub pixel SPX4.

Referring to n FIG. 9B, the second color filter CF-G may be on the first sub pixel SPX1, the first partial color filter CF-B1 may be on the second sub pixel SPX2, the third color filter CF-R may be on the third sub pixel SPX3, and the second partial color filter CF-B2 may be on the fourth sub pixel SPX4.

Referring to FIG. 9C, the first partial color filter CF-B1 may be on the first sub pixel SPX1, the second color filter CF-G may be on the second sub pixel SPX2, the third color filter CF-R may be on the third sub pixel SPX3, and the second partial color filter CF-B2 may be on the fourth sub pixel SPX4. Also, in the organic light emitting display panel DP in FIG. 8A, organic light emitting devices may be disposed in a different manner from that in FIG. 8B, on each of the first to fourth sub pixels SPX1, SPX2, SPX3, and SPX4 which constitute the one pixel PX-T2.

Figure 10:
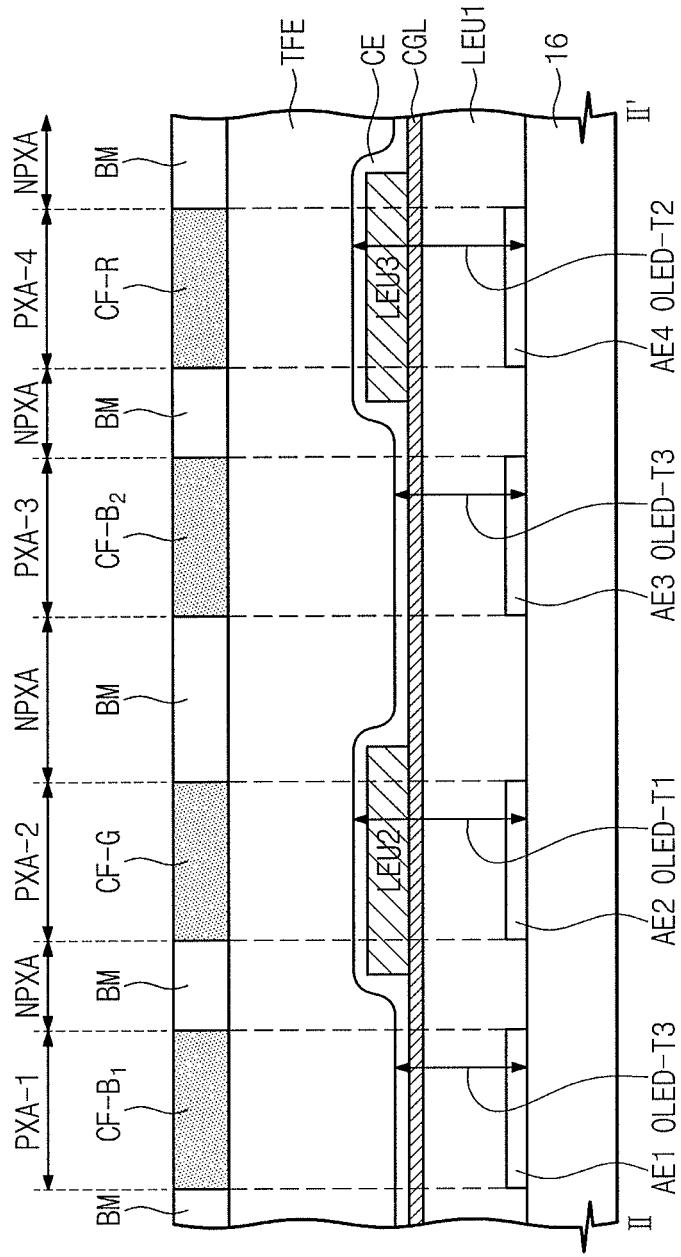
FIG. 10 illustrates an embodiment of sub pixels of one pixel.

FIG. 10 illustrates a cross-sectional view of an example of first to fourth sub pixels SPX1, SPX2, SPX3, and SPX4 constituting one pixel PX-T2. Referring to FIG. 10, organic light emitting devices OLED-T3, OLED-T1, OLED-T3, and OLED-T2 may be included in each of first to fourth sub pixels SPX1, SPX2, SPX3, and SPX4 in one pixel PX-T2. The organic light emitting devices OLED-T3, OLED-T1, OLED-T3, and OLED-T2 may include only one light emitting unit or two light emitting units.

For example, the organic light emitting devices OLED-T3 may include only a first light emitting unit LEU1. Also, the organic light emitting device OLED-T1 may include the first light emitting unit LEU1 and a second light emitting unit LEU2. The organic light emitting device OLED-T2 may include the first light emitting unit LEU1 and a third light emitting unit LEU3.

According to the current embodiment, a first partial color filter CF-B1 or a second partial color filter CF-B2 may correspond to the organic light emitting device OLED-T3 which includes only the first light emitting unit LEU1. Also, a second color filter CF-G may correspond to the organic light emitting device OLED-T1 including the first light emitting unit LEU1 and the second light emitting unit LEU2, and a third color filter CF-R may correspond to the organic light emitting device OLED-T2 including the first light emitting unit LEU1 and the third light emitting unit LEU3.

For example, the second color filter CF-G may correspond to an anode which the second light emitting unit LEU2 overlaps among first and second anodes AE1 and AE2. The third color filter CF-R may correspond to an anode which the third light emitting unit LEU3 overlaps among third and fourth anodes AE3 and AE4.

Also, the first partial color filter CF-B1 may correspond to an anode which the second light emitting unit LEU2 does not overlap among the first and second anodes AE1 and AE2. The second partial color filter CF-B2 may correspond to an anode which the third light emitting unit LEU3 does not overlap among the third and fourth anodes AE3 and AE4.

A charge generating layer CGL illustrated in FIG. 10 may be included in all the first to fourth sub pixels SPX1, SPX2, SPX3, and SPX4. In one embodiment, the charge generating layer CGL may not be provided to the first sub pixel SPX1 and the third sub pixel SPX3 on which only the first light emitting unit LEU1 is disposed.

Figure 11A:
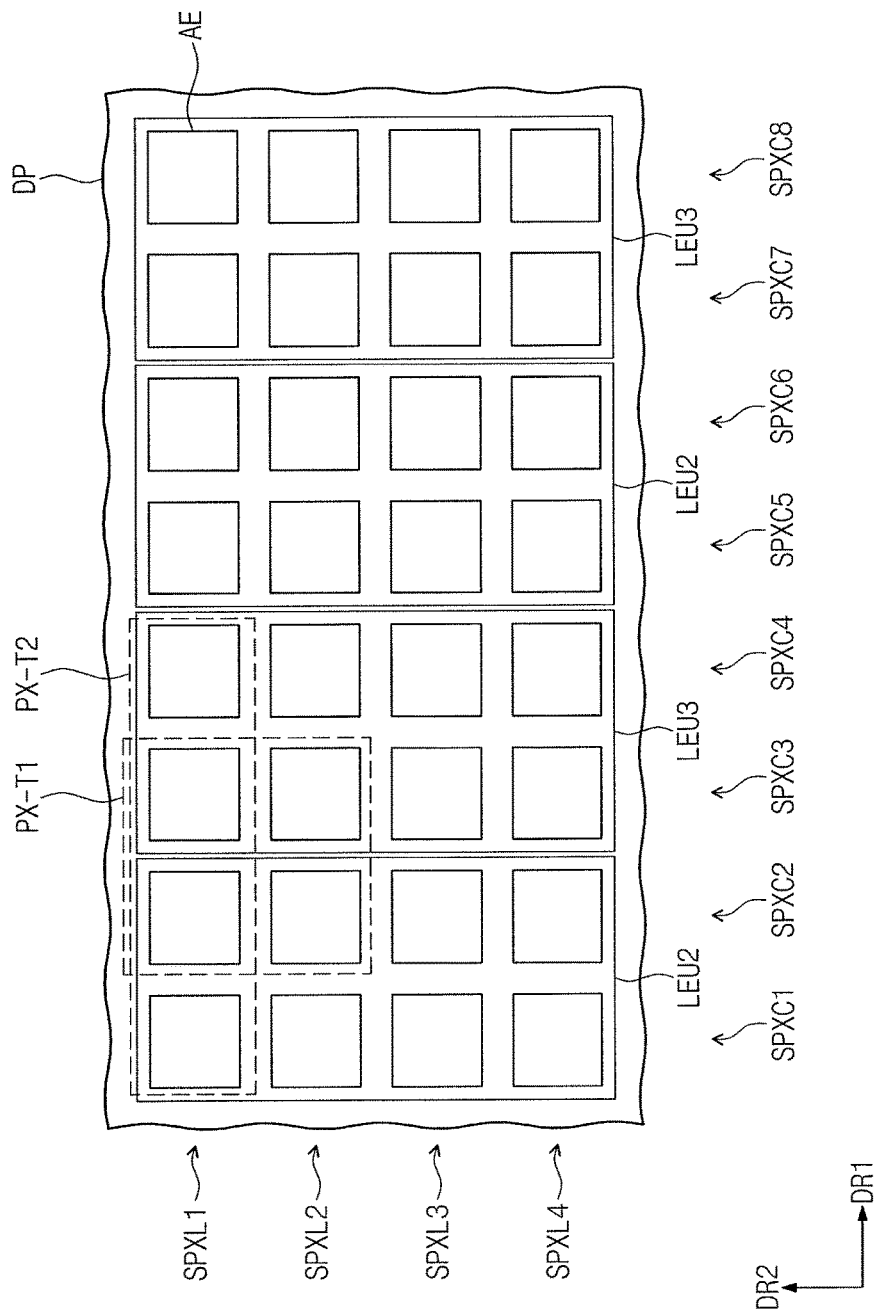
FIGS. 11A-11B illustrate embodiments of deposition methods for light emitting units.
Figure 11B:
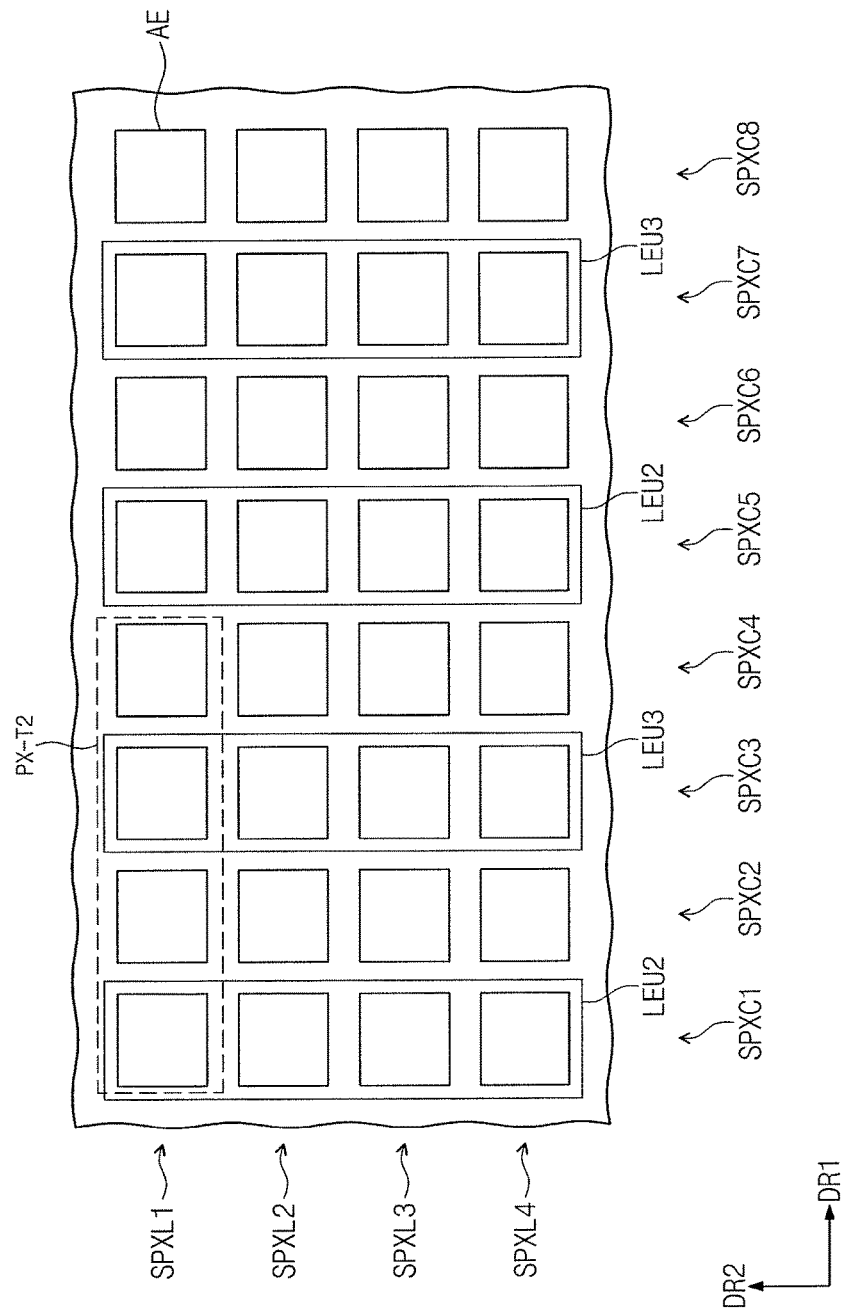

FIGS. 11A and 11B illustrate examples of the deposition of light emitting units in each of the organic light emitting devices in one pixel. In a display panel DP of an organic light emitting display device, a plurality of anodes AE may correspond respectively to a plurality of columns arrayed in a first directional axis DR1 and a plurality of rows arrayed in a second directional axis DR2.

In a more specific example, the anodes AE in the organic light emitting display device may be configured in a plurality of columns SPXC1, SPXC2, SPXC3, SPXC4, SPXC5, SPXC6, SPXC7, and SPXC8 which extend in the second directional axis DR2 and are arrayed in the first directional axis DR1 perpendicular to the second directional axis DR2. Also, the anodes AE in the organic light emitting display panel DP may be configured in a plurality of rows SPXL1, SPXL2, SPXL3, and SPXL4 which extend in the first directional axis DR1 and arrayed in the second directional axis DR2 perpendicular to the first directional axis DR1. A first light emitting unit LEU1 may be deposited to entirely overlap the anodes AE. An open mask may be used, for example, to deposit the first light emitting unit LEU1.

Second and third light emitting units LEU2 and LEU3 may be deposited to respectively overlap portions on the first light emitting unit LEU1 after the first light emitting unit LEU1 is deposited. For example, the second and third light emitting units LEU2 and LEU3 may be deposited to overlap only a portion of rows or only a portion of columns which are formed by the plurality of anodes AE. In this case, a mask having a plurality of openings may be used to deposit the second and third light emitting units LEU2 and LEU3. For example, the openings may be formed at positions and sizes which correspond to a portion of the rows or a portion of the columns formed by anodes AE.

Any one of the second and third light emitting units LEU2 and LEU3 may be deposited first and then the other may be deposited. The second and third light emitting units LEU2 and LEU3 may be deposited to have substantially the same height as each other on the first light emitting unit LEU1. For example, each of the second and third light emitting units LEU2 and LEU3 may be deposited to respectively overlap two adjacent columns among the columns formed by the plurality of anodes AE. Also, the two columns on which the second light emitting unit LEU2 is deposited and the two columns on which the third light emitting unit LEU3 is deposited may be alternately disposed.

For example, as illustrated in FIG. 11A, the second light emitting unit LEU2 may be deposited to entirely overlap first and second columns SPXC1 and SPXC2 and fifth and sixth columns SPXC5 and SPXC6 formed by the anodes AE. Also, the third light emitting unit LEU3 may be deposited to entirely overlap third and fourth columns SPXC3 and SPXC4 and seventh and eighth columns SPXC7 and SPXC8 formed by the anodes AE.

Each of the second and third light emitting units LEU2 and LEU3 may be deposited to respectively overlap two adjacent rows. Likewise, the two rows on which the second light emitting unit LEU2 is deposited and the two rows on which the third light emitting unit LEU3 is deposited may be alternately disposed. As such, when the second and third light emitting units LEU2 and LEU3 are deposited to respectively overlap the two rows among the anodes, disposition of the color filters respectively corresponding to the sub pixels of one pixel may be changed according to the deposition positions of the second and third light emitting units LEU2 and LEU3.

As illustrated in FIG. 11A, when the second and third light emitting units LEU2 and LEU3 are disposed, the one pixel PX-T1 described above in FIG. 5A and the one pixel PX-T2 described above in FIG. 8A may be formed to include columns of anodes AE, in which the second and third light emitting units LEU2 and LEU3 are adjacently deposited. For example, the one pixel PX-T1 may be formed by the anodes AE arrayed in a matrix shape among the anodes AE constituting the second and third columns SPXC2 and SPXC3. For example, among the anodes AE, anodes AE in the first row and second column SPXL1 and SPXC2 and the second row and second column SPXL2 and SPXC2, on which the second light emitting unit LEU2 is deposited, and anodes AE in the first row and third column SPXL1 and SPXC3 and the second row and third column SPXL2 and SPXC3, on which the third light emitting unit LEU3 is deposited, may constitute the one pixel.

In another example, one pixel PX-T2 may be formed by anodes AE constituting a first to fourth columns SPXC1, SPXC2, SPXC3, and SPXC4 which are arrayed in one direction (first direction DR1). For example, among the plurality of anodes AE, anodes AE in the first row and first column SPXL1 and SPXC1 and the first row and second column SPXL1 and SPXC2, on which the second light emitting unit LEU2 is deposited, and anodes AE in the first row and third column SPXL1 and SPXC3 and the first row and fourth column SPXL1 and SPXC4, on which the third light emitting unit LEU3 is deposited, may constitute the one pixel.

Referring to FIG. 11B, unlike FIG. 11A, each of second and third light emitting units LEU2 and LEU3 may be deposited to respectively overlap one column among a plurality of columns formed by a plurality of anodes AE. In this case, the second and third light emitting units LEU2 and LEU3 may be alternately deposited with each other with one column disposed therebetween. For example, the second light emitting unit LEU2 may be deposited to entirely overlap each of the first, and fifth columns SPXC1, and SPXC5, which are formed by the plurality of anodes AE. Also, the third light emitting unit LEU3 may be deposited to entirely overlap each of the third and seventh columns SPXC3 and SPXC7, which are formed by the plurality of anodes AE.

Each of the second and third light emitting units LEU2 and LEU3 may be deposited to respectively overlap each of rows formed by the anodes AE. Likewise, one row on which the second light emitting unit LEU2 is deposited and one row on which the third light emitting unit LEU3 is deposited may be alternately disposed with one row disposed therebetween. As such, when the second and third light emitting units LEU2 and LEU3 are deposited to respectively overlap each of the rows, disposition of color filters respectively corresponding to sub pixels of one pixel may be changed according to the deposition positions of the second and third light emitting units LEU2 and LEU3.

As such, when the second and third light emitting units LEU2 and LEU3 are deposited, the one pixel described above in FIG. 8A may be defined as one pixel. The one pixel PX-T2 may be formed to include a column deposited to which the second light emitting unit LEU2 overlaps, and a column deposited to which the third light emitting unit LEU3 overlaps. For example, as in FIG. 11B, the one pixel PX-T2 may be formed by anodes AE respectively corresponding to the first row and the first column SPXL1 and SPXC1, the first row and the second column SPXL1 and SPXC2, the first row and the third column SPXL1 and SPXC3, and the first row and the fourth column SPXL1 and SPXC4.

As described with respect to FIGS. 5A to 10, a first color filter CF-B may include a first partial color filter CF-B1 and a second partial color filter CF-B2. Each of the first and second partial color filters CF-B1 and CF-B2 may correspond to each of two sub pixels. Unlike this, the first color filter CF-B may be integrally disposed to correspond to adjacent sub pixels in one pixel.

Figure 12A:
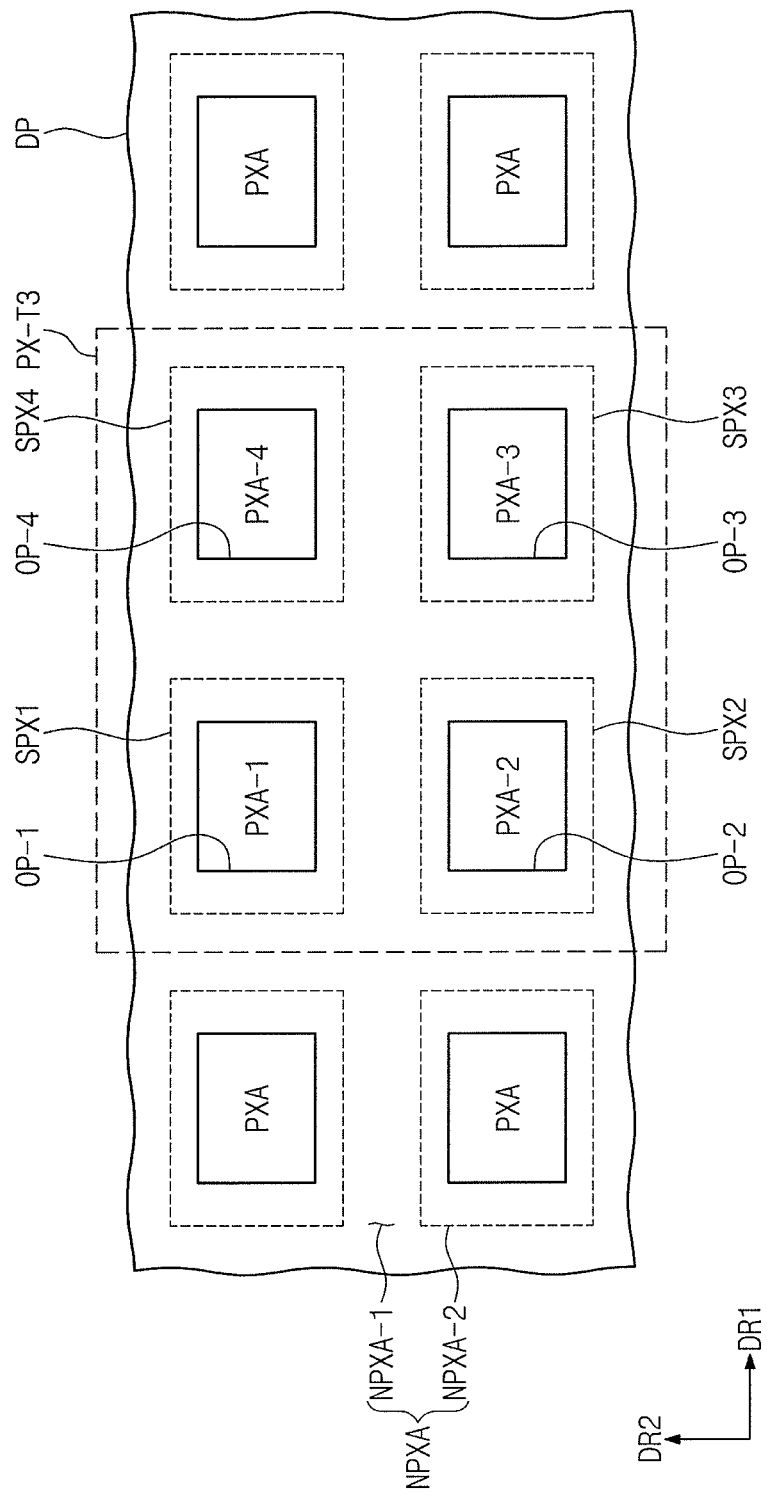
FIG. 12A illustrates another embodiment of an organic light emitting display panel.

FIG. 12A illustrates a plan view of an embodiment of an organic light emitting display panel DP including sub pixels SPX1, SPX2, SPX3, and SPX4 arrayed in a matrix shape.

Figure 12B:
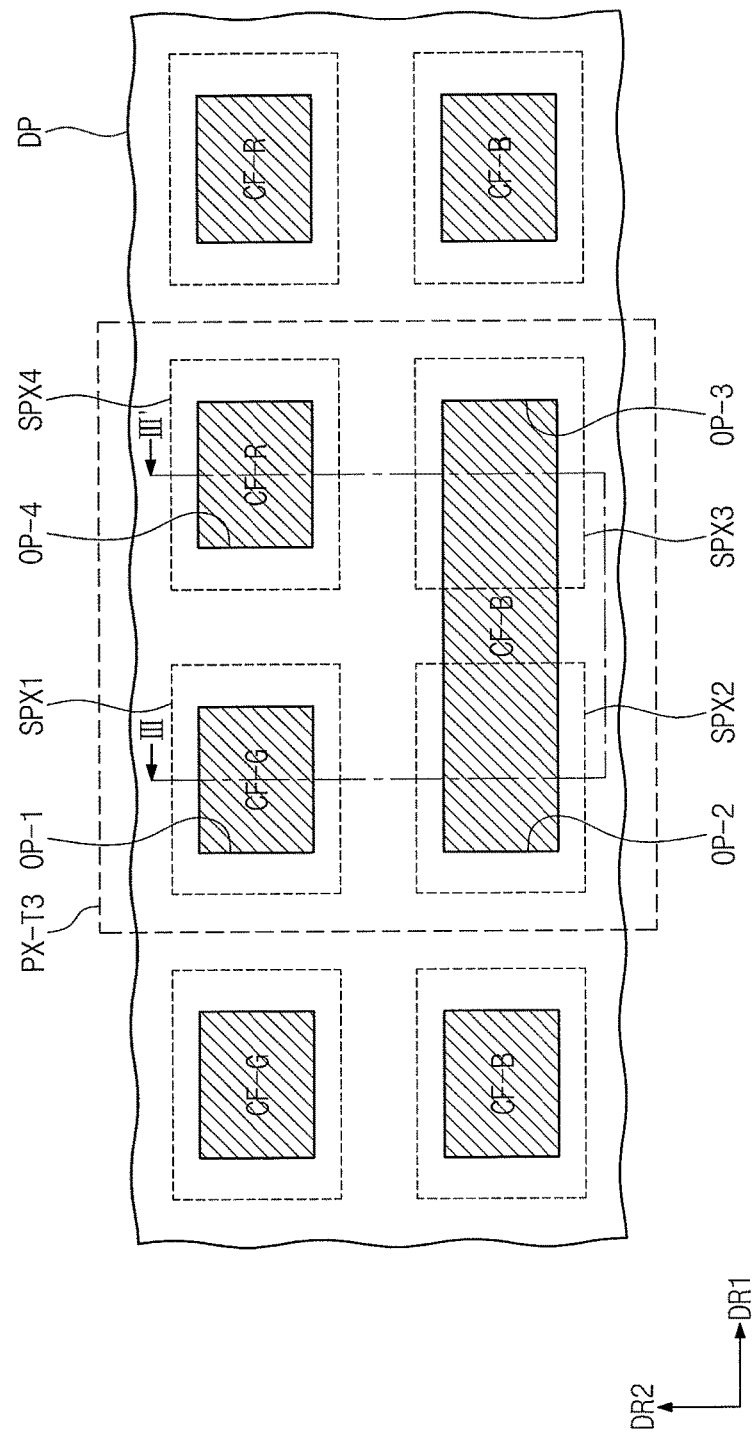
FIG. 12B illustrates an embodiment of color filters corresponding to sub pixels arrayed in a matrix shape, an FIG. 12C illustrates a cross-sectional view of sub pixels arrayed in a matrix shape.
Figure 12C:
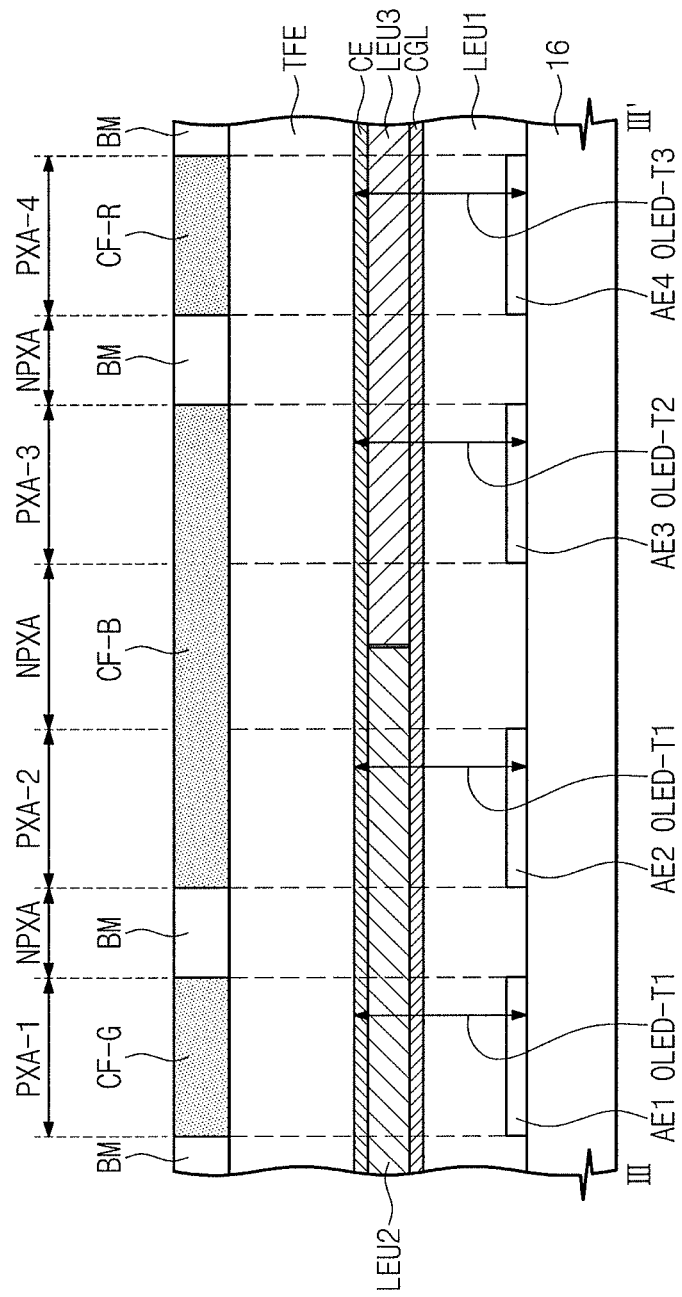

FIG. 12B illustrates a plan view of an embodiment of color filters CF-G, CF-B, and CF-R corresponding to the sub pixels SPX1, SPX2, SPX3, and SPX4 arrayed in a matrix shape. FIG. 12C illustrates a cross-sectional view of an embodiment of the sub pixels SPX1, SPX2, SPX3, and SPX4 arrayed in a matrix shape.

Referring to FIG. 12A, first to fourth sub pixels SPX1, SPX2, SPX3, and SPX4 which are arranged in a matrix shape may define one pixel PX-T3.

Referring to FIG. 12B, a first color filter CF-B may correspond to the second and third sub pixels SPX2 and SPX3. Also, a second color filter CF-G may correspond to the first sub pixel SPX1, and a third color filter CF-R may correspond to the fourth sub pixel SPX4.

Referring to FIG. 12C, a base surface 16 may include first to fourth light emitting regions PXA-1, PXA-2, PXA-3 and PXA-4 respectively corresponding to first to fourth anodes AE1, AE2, AE3, and AE4, and a non-light emitting region NPXA between the first to fourth light emitting regions PXA-1, PXA-2, PXA-3 and PXA-4.

The first color filter CF-B may overlap the second and third light emitting regions PXA-2 and PXA-3 and a portion of the non-light emitting region NPXA between the second and third light emitting regions PXA-2 and PXA-3. The second color filter CF-G may overlap the first light emitting region PXA-1. The third color filter CF-R may overlap the fourth light emitting region PXA-4. Accordingly, a black matrix between the second and third light emitting regions PXA-2 and PXA-3 may not be provided.

Unlike FIG. 12A, the first color filter CF-B may be integrally disposed to correspond to two adjacent sub pixels among the sub pixels SPX1, SPX2, SPX3, and SPX4 which constitute one pixel PX-T3. For example, the first color filter CF-B may correspond to the first and fourth sub pixels SPX1 and SPX4. The first color filter CF-B may overlap a portion of the non-light emitting region NPXA on the first and fourth light emitting regions PXA-1 and PXA-4 and between the first and fourth light emitting regions PXA-4 and PXA-3.

Figure 13A:
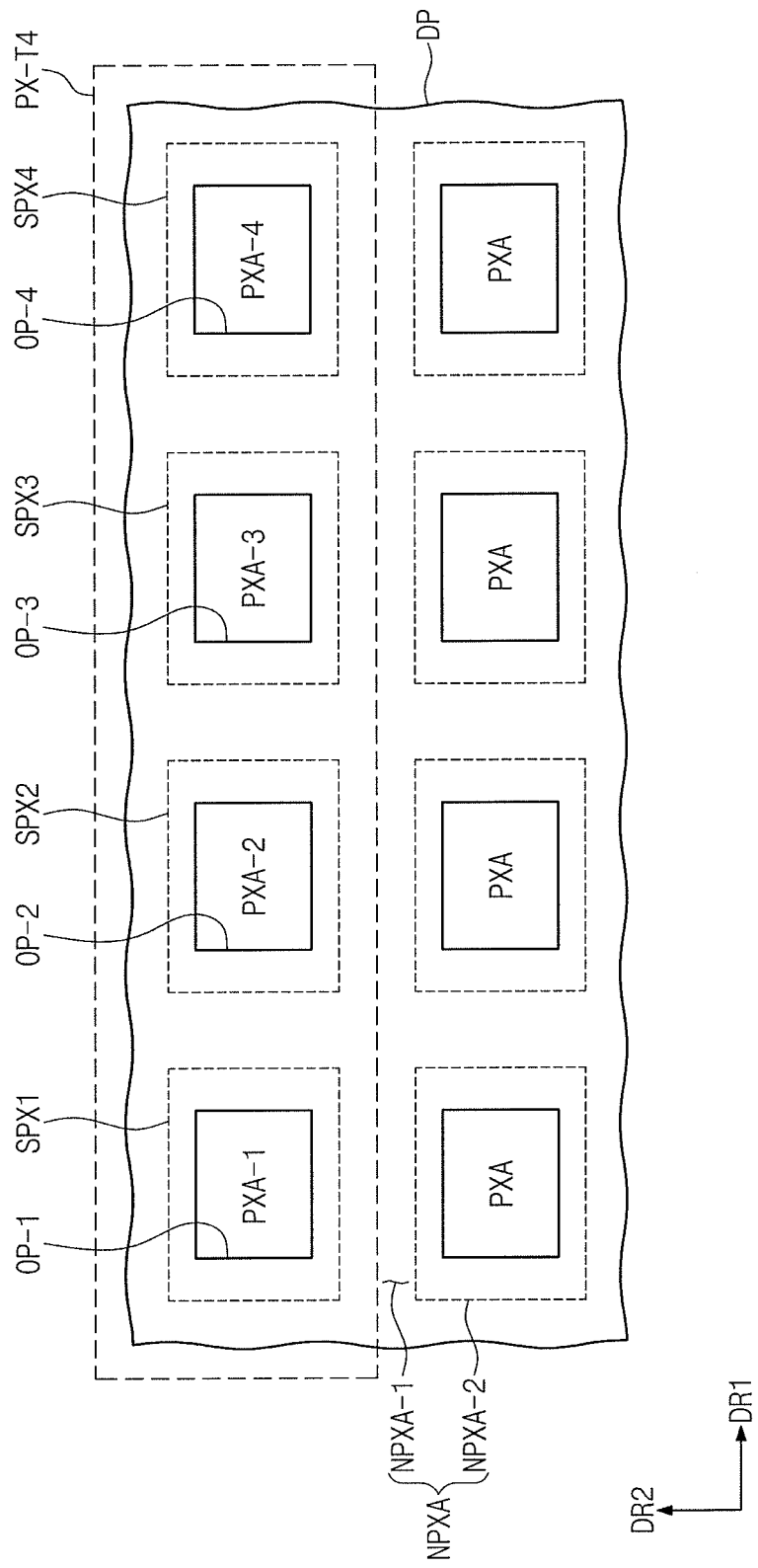
FIG. 13A illustrates another embodiment of an organic light emitting display panel.
Figure 13B:
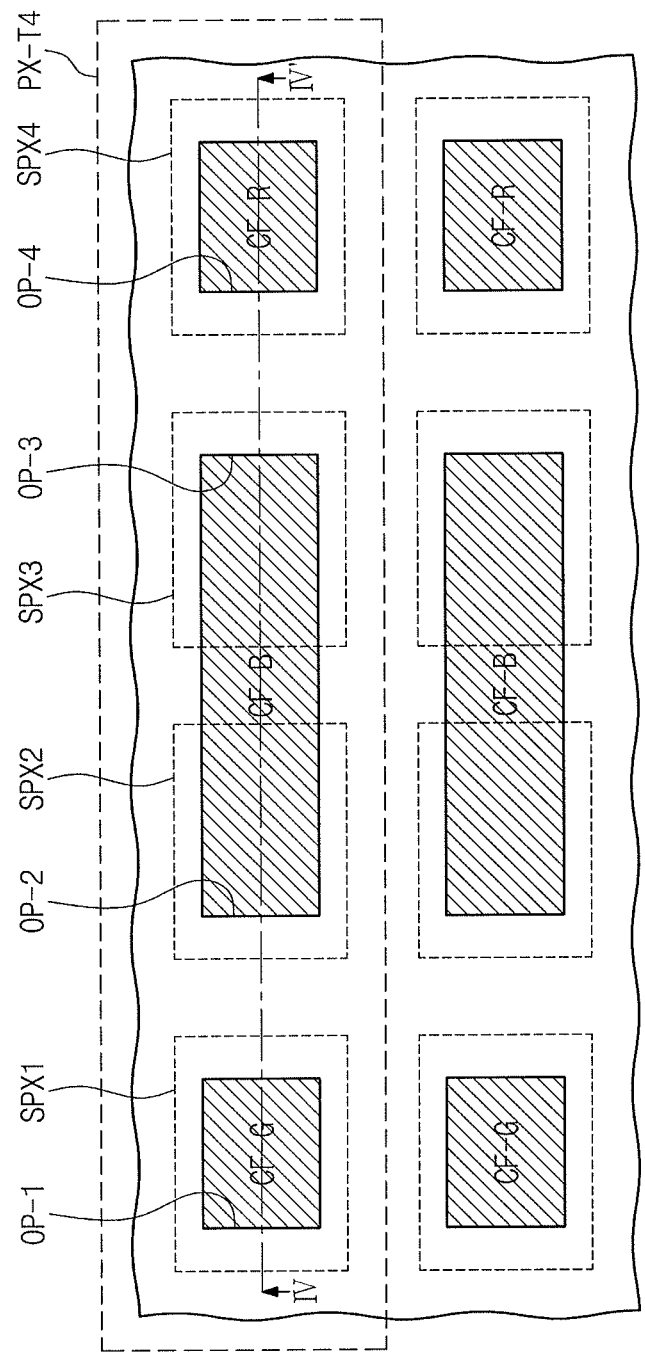
FIG. 13B illustrates an embodiment of color filters corresponding to sub pixels arrayed in one direction.
Figure 13C:
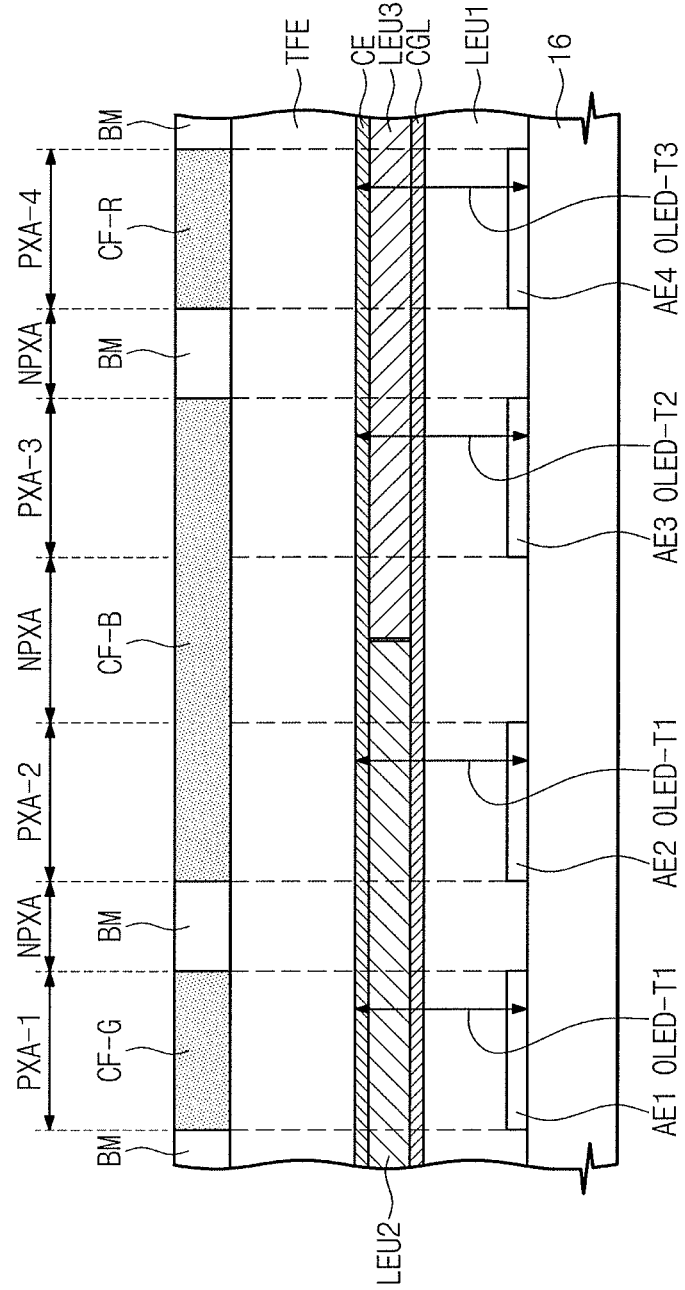
FIGS. 13C and 13D illustrate cross-sectional views of sub pixels arrayed in one direction.
Figure 13D:
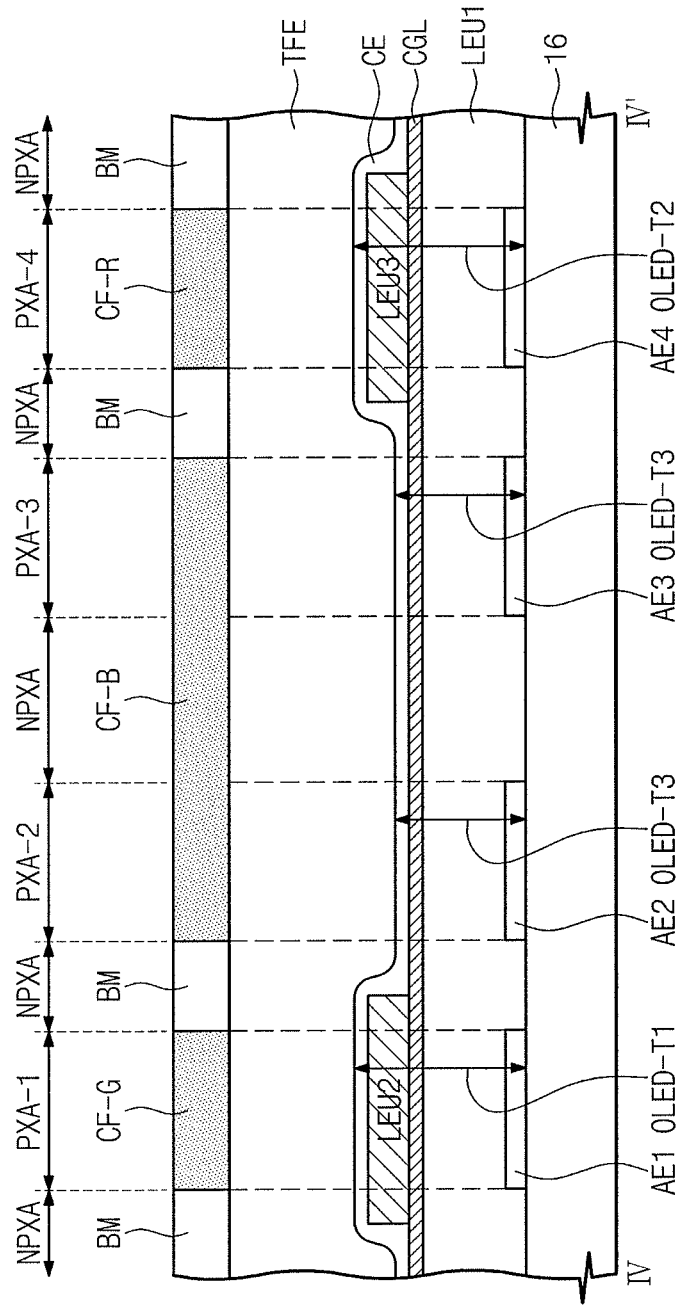

FIG. 13A illustrates a plan view of an embodiment of an organic light emitting display panel DP including sub pixels SPX1, SPX2, SPX3, and SPX4 arrayed in one direction DR1. FIG. 13B illustrates a plan view of an embodiment of color filters CF-G, CF-B, and CF-R corresponding to sub pixels SPX1, SPX2, SPX3, and SPX4 arrayed in the one direction DR1. FIGS. 13C and 13D are cross-sectional views of the sub pixels SPX1, SPX2, SPX3, and SPX4 which are arrayed in the one direction DR1.

Referring to FIG. 13A, first to fourth sub pixels SPX1, SPX2, SPX3, and SPX4 are arranged in one direction DR1 and may define one pixel PX-T4.

Referring to FIG. 13B, a first color filter CF-B may correspond to the second and third sub pixels SPX2 and SPX3. Also, a second color filter CF-G may correspond to the first sub pixel SPX1 and a third color filter CF-R may correspond to the fourth sub pixel SPX4.

Referring to FIG. 13C, the first color filter CF-B may overlap second and third light emitting regions PXA-2 and PXA-3 and a portion of a non-light emitting region NPXA on the second and third light emitting regions PXA-2 and PXA-3. The second color filter CF-G may overlap the first light emitting region PXA-1 and the third color filter CF-R may overlap the fourth light emitting region PXA-4. Accordingly, a black matrix BM between the second and third light emitting regions PXA-2 and PXA-3 may not be provided.

Referring to FIG. 13D, an organic light emitting device OLED-T3 including only one light emitting unit may be in organic light emitting devices OLED-T1, OLED-T2, and OLED-T3. In this case, the second and third light emitting units LEU2 and LEU3 may overlap only any one anode.

The second color filter CF-G may correspond to a first and AE1 which the second light emitting unit LEU2 overlaps. The third color filter CF-R may correspond to a fourth anode AE4 which the third light emitting unit LEU3 overlaps. Also, the first color filter CF-B may correspond to the second and third anodes AE2 and AE3. For example, the first color filter CF-B may overlap the second and third light emitting regions PXA-2 and PXA-3 and a portion of the non-light emitting region NPXA between the second and third light emitting regions PXA-2 and PXA-3. A black matrix BM may not be provided on a portion of the non-light emitting region NPXA between the second and third light emitting regions PXA-2 and PXA-3.

As such, since light may be emitted from a portion of the non-light emitting region between the light emitting regions respectively corresponding to adjacent anodes, aperture ratio may be improved.

FIG. 14 illustrates an embodiment of a method for manufacturing an organic light emitting display device. The method includes forming first to fourth electrodes on a base substrate (S1). The first to fourth electrodes may be framed, for example, by a photolithography, deposition, or sputtering process on an insulating layer of the base substrate. The first to fourth electrodes may be, for example, as illustrated in FIGS. 11A and 11B, first to fourth anodes AE1, AE2, AE3, and AE4 arrayed in a matrix shape, or first to fourth anodes arrayed in one direction.

Then, a first light emitting unit overlapping the first to fourth electrodes is formed on the base surface (S2). The first light emitting unit may be deposited, for example, on the base surface to entirely overlap the first to fourth anodes and regions between the first to fourth anodes through an open mask.

A charge generation layer overlapping the first to fourth electrodes is formed on the first light emitting unit (S3). The charge generating layer may be deposited through an open mask to entirely overlap the first to fourth electrodes after the first light emitting unit is deposited.

Then, a second light emitting unit overlapping at least one of the first and second electrodes is formed on the base surface (S4). This is followed by forming a third light emitting unit overlapping at least one of the third and fourth electrodes (S5). For example, the second light emitting unit may be deposited to overlap the first and second electrodes and a region between the first and second electrodes on the base surface after the charge generating layer is deposited. Also, the third light emitting unit may be deposited to overlap the third and fourth electrodes and a region between the third and fourth electrodes on the base surface after the charge generating layer is deposited.

Then, a fifth electrode is formed in a predetermined (e.g., normal) direction of the base surface (S6). The fifth electrode may be a cathode electrode which entirely overlaps the first to fourth electrodes in the normal direction of the first to fourth electrodes. The cathode may be formed, for example, through a deposition or sputtering process based on the layer structure.

A color filter layer is formed on the fifth electrode (S7). The color filter layer may include a first color filter for transmitting light in a first wavelength range generated from the first light emitting unit, a second color filter for transmitting light in a second wavelength range generated from the second light emitting unit, and a third color filter for transmitting light in a third wavelength range generated from the third light emitting unit, and a black matrix.

In the examples in FIGS. 5A to 10 and the example in FIGS. 12A to 13D, the black matrix may be deposited, for example, using different masks. For example, when the black matrix of the example in FIGS. 12A to 13D is deposited, a mask having a structure which makes the black matrix not provided between two sub pixels to which the first color filter is correspondingly disposed.

In accordance with one or more of the aforementioned embodiments, light emitted from different light emitting units is mixed in a pixel to implement white light. Furthermore, blue light is emitted from one pixel in a ratio greater than other light. Thus, the disadvantage of a blue light emitting unit having a relatively short service life or low efficiency may be reduced or avoided.

Example embodiments have been disclosed herein, and although specific terms are employed, they are used and are to be interpreted in a generic and descriptive sense only and not for purpose of limitation. In some instances, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. An organic light emitting display device, comprising:
   first to fourth electrodes spaced apart from each other on a base surface;
   a fifth electrode spaced apart from the first to fourth electrodes in a normal direction of the base surface;
   a first light emitter between the first to fourth electrodes and the fifth electrode and overlapping the first to fourth electrodes;
   a second light emitter between at least one of the first and second electrodes and the fifth electrode, overlapping at least one of the first and second electrodes and not overlapping the third electrode and the fourth electrode;
   a third light emitter between at least one of the third and fourth electrodes and the fifth electrode, overlapping at least one of the third and fourth electrodes, and not overlapping the first electrode, the second electrode, and the second light emitter;
   a charge generating layer between the first and second light emitters and between the first and third light emitters; and
   a color filter layer including a first color filter to transmit light from the first light emitter in a first wavelength range having a peak value in a range of about 400 nm to about 500 nm, a second color filter to transmit from the second light emitter in a second wavelength range having a peak value in a range of about 500 nm to about 600 nm, and a third color filter to transmit light from the third light emitter in a third wavelength range having a peak value in a range of about 600 nm to about 700 nm.

2. The device as claimed in claim 1, wherein:
   the first to fourth electrodes are in a matrix on the base surface,
   the matrix includes two rows and two columns, and
   the first to fourth electrodes are sequentially arranged counterclockwise from an upper left end of the matrix.

3. The device as claimed in claim 2, wherein:
   the second light emitter overlaps the first and second electrodes, and
   the third light emitter overlaps the third and fourth electrodes.

4. The device as claimed in claim 3, wherein:
   the second light emitter is between the first light emitter and fifth electrodes, and
   the third light emitter is between the first light emitter and fifth electrodes.

5. The device as claimed in claim 3, wherein:
   the first color filter includes first and second partial color filters,
   the first and second partial color filters correspond to each of the first and third electrodes or to each of the second and fourth electrodes.

6. The device as claimed in claim 5, wherein:
   the first and second partial color filters correspond to each of the first and third electrodes,
   the second color filter corresponds to the second electrode, and
   the third color filter corresponds to the fourth electrode.

7. The device as claimed in claim 3, wherein the first color filter corresponds to each of the first and fourth electrodes or to the second and third electrodes.

8. The device as claimed in claim 7, wherein:
   the first color filter corresponds to each of the second and third electrodes,
   the second color filter corresponds to the first electrode, and
   the third color filter corresponds to the fourth electrode.

9. The device as claimed in claim 7, wherein the base surface includes:
   first to fourth light emitting regions corresponding to each of the first to fourth electrodes, and
   a non-light emitting region between the first to fourth light emitting regions, wherein the first color filter overlaps the first and fourth light emitting regions and portions of the non-light emitting region between the first and fourth light emitting regions or overlaps the second and third light emitting regions and portions of the non-light emitting region between the second and third light emitting regions.

10. The device as claimed in claim 2, wherein:
    the second light emitter overlaps the first and fourth electrodes, and
    the third light emitter overlaps the second and third electrodes.

11. The device as claimed in claim 1, wherein the first to fourth electrodes are sequentially arrayed on the base surface in one direction.

12. The device as claimed in claim 11, wherein:
    the base surface includes first to fourth light emitting regions that correspond to each of the first to fourth electrodes, and a non-light emitting region between the first to fourth light emitting regions, and
    the color filter layer includes a black matrix overlapping the non-light emitting region, the first color filter including a first partial color filter corresponding to one of the first or second electrodes and a second partial color filter corresponding to one of the third or fourth electrodes.

13. The device as claimed in claim 12, wherein:
    the second light emitter overlaps the first and second electrodes, and
    the third light emitter overlaps the third and fourth electrodes.

14. The device as claimed in claim 12, wherein:
- the second light emitter overlaps an electrode, which does not correspond to the first partial color filter, among the first and second electrodes, and
- the third light emitter overlaps an electrode, which does not correspond to the second partial color filter, among the third and fourth electrodes.

15. The device as claimed in claim 14, wherein:
- the second color filter overlaps the second light emitter in the normal direction of the base surface, and
- the third color filter overlaps the third light emitter in the normal direction of the base surface.

16. The device as claimed in claim 11, wherein the base surface includes:
- first to fourth light emitting regions corresponding to each of the first to fourth electrodes, and
- a non-light emitting region between the first to fourth light emitting regions, wherein the first color filter overlaps the second and third light emitting regions and portions of the non-light emitting region between the second and third light emitting regions.

17. The device as claimed in claim 1, wherein each of the first to third light emitters includes:
- a hole control layer;
- an electron control layer; and
- an organic light emitting layer between the hole control layer and the electron control layer, the organic light emitting layer to emit light in a specific wavelength range.

18. The device as claimed in claim 1, wherein:
- the first color filter overlaps at least one of the first and second electrodes and at least one of the third and fourth electrodes, and
- an area of the first color filter is greater than the areas of each of the second and third color filters.

19. A method for manufacturing an organic light emitting display device, comprising:
- forming a first to fourth electrodes spaced apart from each other on a base surface;
- forming a first light emitter overlapping the first to fourth electrodes on the base surface;
- forming a charge generating layer overlapping the first to fourth electrodes on the first light emitter;
- forming a second light emitter overlapping at least one of the first or second electrodes and not overlapping the third electrode and the fourth electrode on the base surface;
- forming a third light emitter overlapping at least one of the third or fourth electrodes on the base surface and not overlapping the first electrode, the second electrode, and the second light emitter;
- forming a fifth electrode overlapping the first to fourth electrodes in the normal direction of the base surface; and
- forming a color filter layer on the fifth electrode, the color filter layer including a first color filter to transmit light from the first light emitter in a first wavelength range, a second color filter to transmit light from the second light emitter in a second wavelength range, and a third color filter to transmit light from the third light emitter in a third wavelength range, wherein:
- light in the first wavelength range has a peak value in a range of about 400 nm to about 500 nm,
- light in the second wavelength range has a peak value in a range of about 500 nm to about 600 nm,
- light in the third wavelength range has a peak value in a range of about 600 nm to about 700 nm.

* * * * *